US011815349B2

(12) United States Patent
Peterson et al.

(10) Patent No.: US 11,815,349 B2
(45) Date of Patent: Nov. 14, 2023

(54) METHODS AND SYSTEMS FOR INSPECTING INTEGRATED CIRCUITS BASED ON X-RAYS

(71) Applicant: Bruker Nano, Inc., Santa Barbara, CA (US)

(72) Inventors: Brennan Lovelace Peterson, Longmont, CO (US); Hak Chuah Sim, Rancho Santa Margarita, CA (US); Andrew George Reid, San Jose, CA (US); Nabil Farah Dawahre Olivieri, San Jose, CA (US)

(73) Assignee: Bruker Nano, Inc., Santa Barbara, CA (US)

( * ) Notice: Subject to any disclaimer, the term of this patent is extended or adjusted under 35 U.S.C. 154(b) by 280 days.

(21) Appl. No.: 17/394,357

(22) Filed: Aug. 4, 2021

(65) Prior Publication Data

US 2022/0042795 A1 Feb. 10, 2022

Related U.S. Application Data

(60) Provisional application No. 63/062,299, filed on Aug. 6, 2020.

(51) Int. Cl.
*G01B 15/04* (2006.01)
*G01N 23/04* (2018.01)
(Continued)

(52) U.S. Cl.
CPC .......... *G01B 15/045* (2013.01); *G01N 23/04* (2013.01); *G03F 7/70616* (2013.01);
(Continued)

(58) Field of Classification Search
CPC .. G01B 15/045; G01B 2210/56; G01N 23/04; G03F 7/70616; H01L 22/20; H01L 24/10; H01L 2224/16225
See application file for complete search history.

(56) References Cited

U.S. PATENT DOCUMENTS

| 4,809,308 A | 2/1989 | John et al. |
|---|---|---|
| 5,592,562 A | 1/1997 | Rooks |

(Continued)

FOREIGN PATENT DOCUMENTS

JP 2004070949 3/2004

*Primary Examiner* — Mark R Gaworecki
(74) *Attorney, Agent, or Firm* — Boyle Fredrickson S.C.

(57) ABSTRACT

In one embodiment, an automatic high-speed X-ray system may generate a high-resolution X-ray image of an inspected sample at a direction substantially orthogonal to a plane of the inspected sample. The system may determine a first cross-sectional shape of a first portion of a first element of interest in the inspected sample based on grayscale values of the X-ray image associated with the first element of interest. The system may determine a second cross-sectional shape of a second portion of the first element of interest in the inspected sample. The second cross-sectional shape may be determined based on the grayscale values of the X-ray image associated with the first element of interest. The system may determine one or more first metrological parameters associated with the first element of interest in the inspected sample based a comparison of the first cross-sectional shape and the second cross-sectional shape.

20 Claims, 14 Drawing Sheets

(51) Int. Cl.
*G03F 7/00* (2006.01)
*H01L 21/66* (2006.01)
*H01L 23/00* (2006.01)

(52) U.S. Cl.
CPC .............. *H01L 22/12* (2013.01); *H01L 22/20* (2013.01); *G01B 2210/56* (2013.01); *H01L 24/10* (2013.01); *H01L 2224/16225* (2013.01)

(56) References Cited

U.S. PATENT DOCUMENTS

| | | | |
|---|---|---|---|
| 11,688,067 B2* | 6/2023 | Adler | ........................ G01T 1/20 382/128 |
| 2009/0080764 A1 | 3/2009 | Srinivasan et al. | |
| 2015/0270023 A1 | 9/2015 | Adler | |
| 2020/0041425 A1* | 2/2020 | Matoba | ................ G01N 23/046 |

* cited by examiner

5000

Generate an X-ray image of an inspected sample at a direction substantially orthogonal to a plane of the inspected sample, wherein the X-ray image is a high-resolution grayscale image
510

↓

Determine a first cross-sectional shape of a first portion of a first element of interest in the inspected sample, wherein the first cross-sectional shape is determined based on a plurality of grayscale values of the X-ray image associated with the element of interest
520

↓

Determine a second cross-sectional shape of a second portion of the first element of interest in the inspected sample, wherein the second cross-sectional shape is determined based on the plurality of grayscale values of the X-ray image associated with the element of interest
530

↓

Determine one or more metrological parameters associated with the first element of interest in the inspected sample based a comparison of the first cross-sectional shape and the second cross-sectional shape
540

*FIG. 5*

METHODS AND SYSTEMS FOR INSPECTING INTEGRATED CIRCUITS BASED ON X-RAYS

PRIORITY

This application claims the benefit under 35 U.S.C. § 119(e) of U.S. Provisional Patent Application No. 63/062,299, filed 6 Aug. 2020, which is incorporated herein by reference.

TECHNICAL FIELD

This invention relates to integrated circuit manufacturing techniques.

BACKGROUND

An integrated circuit (IC) component may be bonded to a substrate through solder bumps during the manufacturing process. However, in some scenarios, the IC component and the corresponding substrate may be mis-aligned. The inspection techniques using optical photons or electrons to inspect silicon wafers can only inspect ICs from outside because they do not penetrate through the ICs, interposers, or Cu—Cu die to die bonding sufficiently to provide an internal view of the ICs. Since X-rays can penetrate through many layers of packaging, X-ray inspections may provide an internal view of the ICs.

Traditional X-ray technologies such as the computed tomography (CT) need to take a large number of cross section images to reconstruct the 3D model of the inspected objects, which is very time-consuming and not suitable for inspecting ICs.

SUMMARY OF PARTICULAR EMBODIMENTS

Particular embodiments described herein relate to systems and methods for measuring the placement parameters of integrated circuit (IC) components with respect to corresponding substrates based on metrology information of associated solder bumps. An automatic high-speed X-ray inspection system (latterly referred to as "the X-ray inspection system" or "the system") may be used to inspect the packaged ICs or partially packaged ICs to measure the placement information (e.g., alignment parameters such as shifted distances, rotated angles, tilted angles, vertical position offsets, etc.) of the IC components (e.g., the dies) with respect to the corresponding substrates. The system may capture one or more X-ray images (e.g., a top-down X-ray image or multiple X-ray images captured from different angles) of the inspected ICs and determine the metrology information (e.g., sizes, diameters, shapes, positions, etc.) of the solder bumps based on the captured X-ray images. To generate a top-down X-ray image of an inspected sample, the system may generate an X-ray images of an inspected sample at a direction substantially orthogonal to a plane of the inspected sample. The system may use computer algorithms to extract the cross-sectional shapes of different portions of an element of interest in the inspected sample. For example, the system may use an edge filter to extract a first cross-section shape (e.g., an elliptical shape or circular shape) of a first portion (e.g., a top portion) of a solder bump in the inspected sample (e.g., an IC package). Then, the system may use the edge filter to extract a second cross-section shape (e.g., an elliptical shape or circular shape) of a second portion (e.g., a bottom portion) of the same solder bump in the inspected sample. The edge filter may extract or determine these cross-sectional shapes based on the grayscale values of the top-town X-ray image associated with the solder bump in the inspected sample. After that, the system may compare the first and the second cross-sectional shapes to determine one or more metrological parameters (e.g., an offset distance, an offset direction, a size, a relationship) associated with the element of interest and use these metrological parameters to detect defects in the inspected samples. In particular embodiments, the system may compare the X-ray image(s) of the inspected solder bumps to a reference image which is generated based on a reference part (e.g., a standard IC part with the component being aligned with the substrate or an average of a number of IC parts of the same type). The system may subtract the reference X-ray image from the X-ray image of the inspected bumps and determine the metrology information of these solder bumps based on the values of the residual pixels in the residual pattern. After that, the system may calculate the placement parameter values (e.g., alignment parameters) of the IC components based on the metrology information of the associated solder bumps. As a result, the system may indirectly measure the placement parameters of the IC components based on a single top-down X-ray image or several X-ray images captured from different angles.

The embodiments disclosed herein are only examples, and the scope of this disclosure is not limited to them. Particular embodiments may include all, some, or none of the components, elements, features, functions, operations, or steps of the embodiments disclosed above. Embodiments according to the invention are in particular disclosed in the attached claims directed to a method, a storage medium, a system and a computer program product, wherein any feature mentioned in one claim category, e.g. method, can be claimed in another claim category, e.g. system, as well. The dependencies or references back in the attached claims are chosen for formal reasons only. However any subject matter resulting from a deliberate reference back to any previous claims (in particular multiple dependencies) can be claimed as well, so that any combination of claims and the features thereof are disclosed and can be claimed regardless of the dependencies chosen in the attached claims. The subject-matter that can be claimed comprises not only the combinations of features as set out in the attached claims but also any other combination of features in the claims, wherein each feature mentioned in the claims can be combined with any other feature or combination of other features in the claims. Furthermore, any of the embodiments and features described or depicted herein can be claimed in a separate claim and/or in any combination with any embodiment or feature described or depicted herein or with any of the features of the attached claims.

BRIEF DESCRIPTION OF THE DRAWINGS

FIG. 5 illustrates an example method for measuring placement parameters of IC components based on X-rays Note: Elements shown in the drawings are meant to illustrate the functioning of the invention and have not been drawn to scale.

DESCRIPTION OF EXAMPLE EMBODIMENTS

Figure 1A:
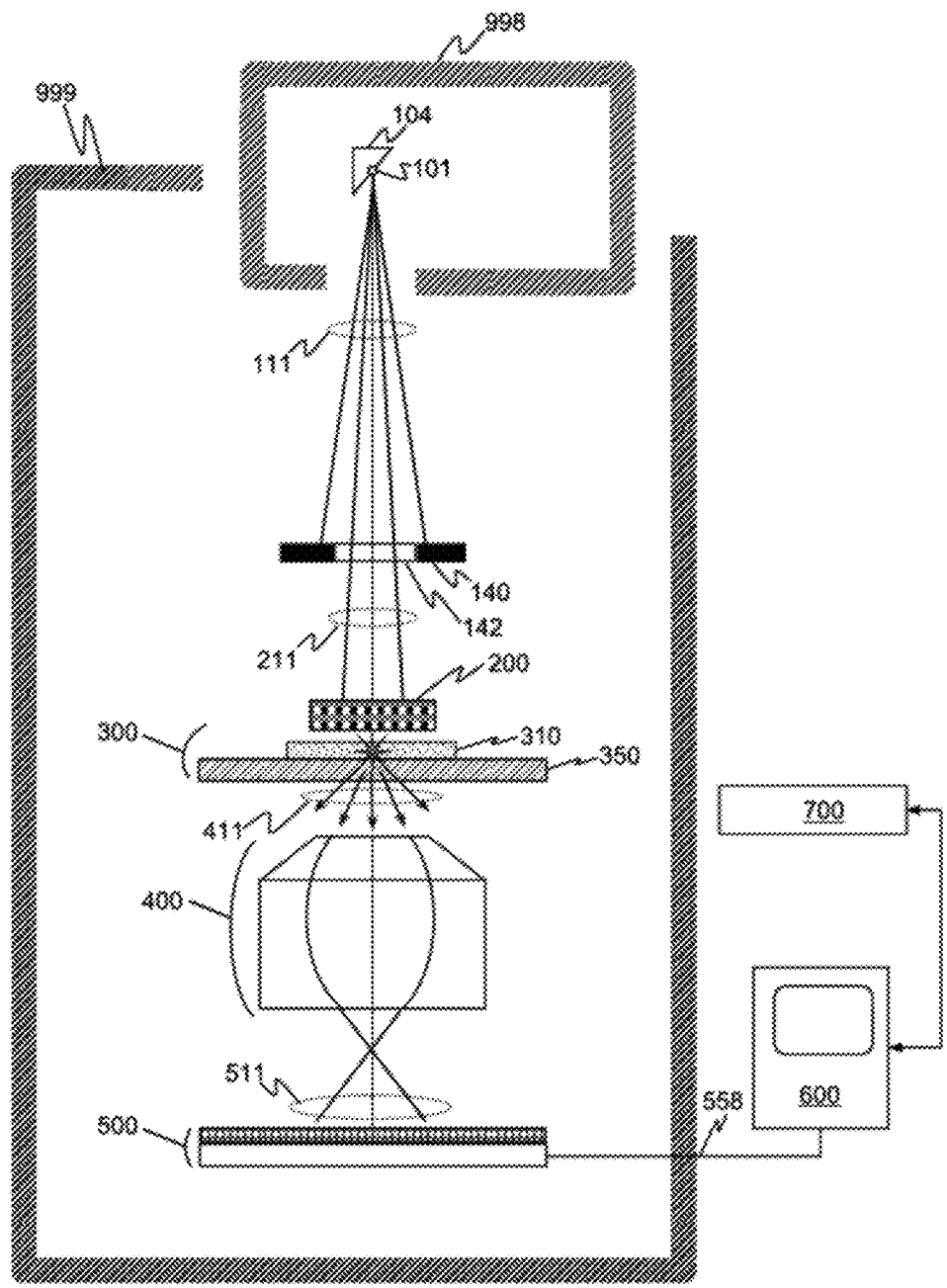
FIG. 1A illustrates an example automatic high-speed X-ray inspection system.

Automated High-Speed X-Ray Inspection System
X-Ray System Framework

The system and methods disclosed herein are related to a system or the use of a system that illuminates an object to be examined or inspected with X-rays, converts X-rays to visible (or near-visible) photons, forms an image of the visible (or near-visible) photons, and then converts the image into an electronic form. In particular embodiments, the system may directly generate X-ray images with no need for converting the X-rays to visible or near-visible photons. As such, the various embodiments of this X-ray image formation system will be presented first, followed by the various embodiments of methods and systems that utilize the X-ray imaging system. In this disclosure, the X-ray imaging system may also be referred to as an automated high-speed X-ray inspection system or X-ray inspection system.

Although many kinds of objects can be examined or inspected using the apparatus disclosed here, it is expected to be especially suitable for the examination and inspection of integrated circuit wafers and packaging assemblies. One example of these are silicon interposers, comprising silicon with multiple TSVs, but the invention can also be used for the inspection of an integrated circuit (IC) itself, a silicon interposer, a silicon dioxide interposer, a printed circuit board (PCB) with or without ICs already installed, a 3D IC package or assembly, a 2.5D IC package or assembly, a multi-chip module (MCM), a system-in-package (SIP) and other electronic microdevices or portion thereof that comprise microscopic structures. These may be examined as incoming materials, completed products, or as partially manufactured objects at any stage of their manufacture for the purpose of metrology, process control, inspection, or yield management.

Non-electronic devices with micro- or nano-structures, such as magnetic recording media, photonic structures and photonic crystals, metamaterials, etc., can also be examined and inspected using this invention. Capacitive sensors, such as fingerprint sensors, can also be examined. A particularly attractive feature of the apparatus is that it is possible to make non-destructive, high-resolution observations and measurements of features within an object that cannot otherwise be seen using electrons or optical photons, as are used in conventional metrology and inspection tools.

In general, objects suitable for use with this invention will comprise at least one flat side. Examples include: electronic circuits on semiconductor wafers, parts of wafers or selected areas on wafers; integrated circuit chips, dice, assemblies, packages, or portions thereof; micro-fluidic devices; micro-electro-mechanical systems (MEMS), including accelerometers, gyros, magnetic and capacitive sensors and the like; photonic devices, particularly those fabricated using planar waveguides; biological tissues, including stained samples; photomasks or templates for printing or fabricating any of the above mentioned devices; and solar cells, parts thereof or parts pertaining to solar cells. Other objects without flat sides may be observed and inspected as well, but the image quality may not be uniform for objects of irregular dimensions.

In particular embodiments, the X-ray inspection system as described in this disclosure may be a high-speed X-ray inspection system. In particular embodiments, the high-speed X-ray inspection system may have a higher measurement/inspection speed than traditional X-ray systems (e.g., 100 times faster than traditional X-ray systems). As an example and not by way of limitation, the high-speed X-ray inspection system may be capable of inspecting electronic components or devices with an image collection time of approximately 33 milliseconds. In particular embodiments, the X-ray inspection system as described in this disclosure may be an automated X-ray inspection system. In particular embodiments, the automated X-ray inspection system may include one or more computers or controllers and instructions stored in one or more computer media. The automated measurement process of the automated X-ray inspection system may be controlled by the computers or controllers by executing corresponding instructions. The automated measurement process of the automated X-ray inspection system may not need interventions from human operators and may be automatically performed following particular procedures.

In particular embodiments, the X-ray inspection system as described in this disclosure may use one more artificial intelligence (AI) modules and/or machine-learning models. In particular embodiments, the artificial intelligence (AI) modules may be or include any suitable methods, processes, and/or algorithm performed by one or more computing systems. In particular embodiments, the machine-learning models may be or include, for example, but are not limited to, a rule-based algorithm, a random forest model, a neutral network or any suitable machine-learning models. In particular embodiments, the X-ray inspection system as described in this disclosure may perform real-time measurements to one or more processes performed by another system (e.g., a drilling machine, a bonding tool, an assembling tool, or any suitable tools). In particular embodiments, the term "real-time measurements" may refer to measurements performed by the X-ray inspection system in parallel to an associated process (e.g., a drilling process, an assembling process, a bonding process, or any suitable processes) without slowing down the associated process. The X-ray inspection system may perform measurements and provide feedback to the systems performing the associated process in a speed higher than or equal to the speed of the associated process.

In particular embodiments, the X-ray inspection system as described in this disclosure may perform in situ and/or inline measurements with one or more other systems or tools (e.g., a drilling machine, a bonding tool, an assembling tool, or any suitable tools). In particular embodiments, the term "in situ measurements" may refer to measurements performed by the X-ray inspection system which is integrated with other systems. For example, the X-ray inspection system may be integrated into a drilling machine and perform in situ measurements to monitor the drilling process of the drilling machine. The in situ measurements may be automatically controlled by one or more computing systems coordinating the X-ray inspection system and the drilling machine. In particular embodiments, the term "inline measurements" may refer to measurements performed by the X-ray inspection system within the same process (e.g., a drilling process, an assembling process, a bonding process, or any suitable processes) performed by another system (e.g., a drilling machine, a bonding tool, an assembling tool, or any suitable tools). For example, during an assembling process performed by an assembling tool, the X-ray system may inspect the assembled components or devices during one or more steps of the assembling process. The components or devices may be automatically transferred from the assembling tool to the X-ray inspection system (e.g., by a robot arm) or may be manually transferred from the assembling tool to the X-ray inspection system (e.g., by a human operator). The X-ray inspection system may provide feedback information automatically to the assembling tool or to a human operator.

X-Ray Imaging System

FIG. 1A illustrates an example automatic high-speed X-ray inspection system 1000A. An X-ray emitter 101 emits X-rays 111. These X-rays are then shaped into a collimated X-ray beam 211, in some embodiments using distance from the emitter 101 and a plate 140 with an aperture 142. This collimated X-ray beam 211 then illuminates an object 200 to be examined. The X-rays that are transmitted through the object 200 illuminate a scintillator assembly 300 comprising a scintillator 310 and, in some embodiments, a support 350 for the scintillator. The scintillator 310 absorbs a portion of the X-rays and releases some of the energy so absorbed with the emission of visible photons 411.

Using an optical system 400, a magnified image 511 of the visible photons 411 emitted by the scintillator is formed on an image detector 500. The image detector 500 converts the intensity of the magnified image 511 to an electronic signal. The image detector 500 can comprise an electronic sensor, such as a charge-coupled device (CCD), or another image sensor known to those skilled in the art. The electronic signal is transmitted to a system of electronics 600 that, in some embodiments can display the image results, and in some embodiments can store the image results and/or perform image processing algorithms on the image results in conjunction with a computer system 700.

For any source emitting ionizing radiation such as X-rays, it is often wise to provide shielding 998 around the X-ray source 100, and in some situations legally required for operation. Such shielding 998 can be a simple enclosure of shaped sheets of lead metal, or a more intricate design fabricated from any of a number of X-ray absorbing materials, such as lead-doped glass or plastic, that will be known to those skilled in the art. Shielding is desirable to keep random X-rays, either directly from the emitter 101 or reflected from some other surface, from causing unwanted effects, particularly spurious signals in the various electronic components used to control the system.

Likewise, for some embodiments, additional shielding 999 around the beam path may also be desired, and in some cases be legally required for operation. Such additional shielding 999 can be a simple enclosure of shaped sheets of lead metal, or a more intricate design fabricated from any of a number of X-ray absorbing materials such as lead-doped glass or plastic, that will be known to those skilled in the art. Additional shielding 999 is desirable to keep random X-rays, either directly from the emitter 101 or reflected from some other surface, from causing unwanted effects, particularly spurious signals in the various electronic components used to control the system.

Because certain image detectors 500 such as those comprising CCD sensors can be particularly sensitive to X-ray exposure, in some embodiments a portion of the scintillator assembly 300 can also be fabricated in whole or in part using a material, such as a lead-doped glass, which absorbs X-rays while transmitting the visible photons 411 emitted by the scintillator.

Figure 1B:
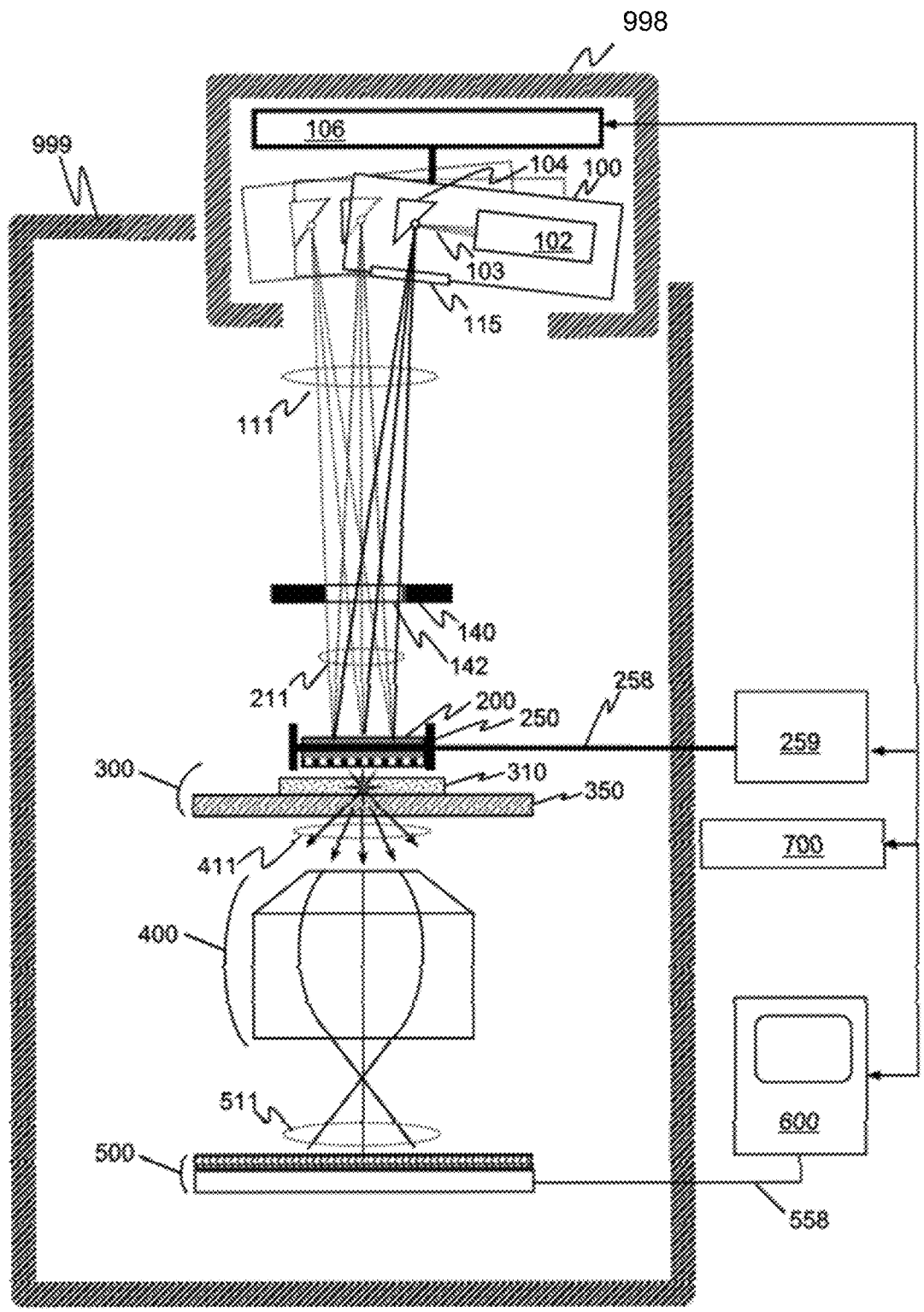
FIG. 1B illustrates an example X-ray inspection system with movable X-ray source with respect to the inspected object for generating X-ray images at different directions.

FIG. 1B illustrates an example X-ray inspection system 1000B with movable X-ray source with respect to the inspected object for generating X-ray images at different directions. As an example and not by way of limitation, the X-ray system may include a mount 106 that can move the position of the X-ray source 100 relative to the object 200, thereby changing the angle of incidence of the X-ray beam on the object. The mount 106 can be designed to allow the X-ray source 100 to swing in the x-z plane, in the y-z plane, or any other combination of axes. The source can also be moved along the z-axis to move the X-ray source 100 closer to the object 200. This may have the effect of making the beam brighter, increasing signal strength, at the cost of having an X-ray beam that is less collimated, reducing resolution. This effect may be reduced or eliminated by reducing the spot size of the X-ray source.

Motion of the X-ray source 100 using the mount 106 can be controlled by the computer system 700 several ways. In some embodiments, the source mount 106 may move the X-ray source 100 to a fixed location to allow an image to be captured. In some embodiments, the mount 106 can move the X-ray source 100 continuously as images are gathered, allowing the dynamic change of X-ray intensity as transmitted through the object 200 to be recorded as a function of illumination angle. In some embodiments, the X-ray emitter 101 can be moved to at least 10 degrees off the normal incidence angle. In some embodiments, further adjustment of the angle of incidence of the X-ray beam 211 on the object 200 can be achieved by coordinating the motion of the X-ray source 100 using the source mount 106 with the motion of the object 200 using the object mount 250. This coordination can be done manually or using the computer system 700. In some embodiments, the shielding 998 will be designed to enclose the X-ray source 100 and the source mount 106. In other embodiments, the shielding 998 can be designed to only enclose the X-ray source, with the mount 106 designed to move the shielding 998 as it moves the X-ray source 100. In some embodiments of the invention, multiple X-ray sources may be used to produce images with different angles of incidence. The X-ray sources may be fixed in space or moveable and may be operated sequentially or simultaneously. They can be operated manually or controlled by one or more computer systems 700.

In particular embodiments, the X-ray imaging system described in this disclosure may be an automated high-speed and high-resolution X-ray imaging system for generating X-ray images of electronic devices. In particular embodiments, the automated high-speed X-ray inspection system may include X-ray detectors having a high sensitivity for X-ray radiation and a large number of grayscale levels (e.g., 10,000+ grayscale levels) with a large dynamic range. In particular embodiments, the X-ray system may include one or more high-resolution X-ray detectors for generating high-resolution X-ray images during the X-ray inspection process. In particular embodiments, the high-resolution X-ray detectors may include a large number of pixels (e.g., 12+ megapixels, 29+ megapixels). In particular embodiments, the system with the high-resolution X-ray detectors may have a spatial resolution of lower than 2 µm, a field of view of 12 mm×12 mm, and a throughput greater than or equal to 3000 mm$^2$ per minute. In particular embodiments, the system with the high-resolution X-ray detectors may have a spatial resolution smaller than 0.5 microns, a field of view of at least 12 mm×12 mm. In particular embodiments, the samples may be inspected with a speed or throughput no less than 300 mm$^2$ per minute. In particular embodiments, the system may generate X-ray images with a frame rate of at least 30 FPS. An X-ray image may be generated in a time period that is equal to or less than 33 milli seconds. More details about the X-ray system may be found in U.S. patent application Ser. No. 15/470,726, filed 27 Mar. 2017, which is incorporated herein by reference.

Overview

Problems Being Solved

Integrated circuit (IC) components may be bonded to respective substrates through solder bumps during the manufacturing process. For example, ICs may be placed on (and later bonded to) respective substrates through a three-dimensional plane-to-plane placement process. However, in some scenarios, the IC components and the corresponding substrates may be mis-aligned. For example, the die of an IC component may be slightly shifted, rotated, tilted, or positioned too far or too close with respect to the corresponding substrate. When this happens, the quality of the manufactured ICs may be negatively affected. As a result, the bonding process of ICs may need to be monitored to avoid producing ICs that have non-optimal quality. The inspection techniques using optical photons or electrons to inspect silicon wafers can only inspect ICs from outside because they do not penetrate through the ICs, interposers, or Cu—Cu die to die bonding sufficiently to provide an internal view of the ICs. Since X-rays can penetrate through many layers of packaging, X-ray inspections may provide an internal view of the ICs. However, traditional X-ray technologies such as the computed tomography (CT) need to take a large number of cross section images to reconstruct the 3D model of the inspected objects, which is very time-consuming and not suitable for being used to inspect ICs.

Solution

In particular embodiments, an automatic high-speed X-ray inspection system (latterly referred to as "the X-ray inspection system" or "the system") may be used to inspect the packaged ICs (or partially packaged ICs) to measure the metrology information (e.g., dimensional parameters and alignment parameters) of the IC components (e.g., dimensional information of the die). The system may capture one or more X-ray images (e.g., a top-down X-ray image or multiple X-ray images captured from different angles) of the inspected ICs and determine the metrology information (e.g., size, diameter, shape, position, etc.) of the solder bumps based on the captured X-ray images. Then, the system may calculate the metrology information (e.g., dimensional parameters and alignment parameters) of the IC components based on the metrology information of the associated solder bumps. As a result, the system may indirectly measure the alignment parameters of the IC components based on a single top-down X-ray images or several X-ray images captured from different angles.

Benefits and Advantages

By using a single top-down X-ray images or several X-ray images captured from different angles, particular embodiments of the system may accurately determine the metrology information of the solder bumps without capturing a large number of cross-section X-ray images like the traditional CT-based X-ray systems. By using the metrology information of the solder bumps, particular embodiments of the system may accurately determine the alignment parameters or placement parameters of the ICs components (e.g., shifted distances, tilted angles, rotated angels, Z-direction position offset distances). By using the X-ray images and the metrology technologies, particular embodiments of the system may automatize the measurement process without relying on human engineers to interpret the inspection data. As a result, particular embodiments of the system may effectively inspect ICs (e.g., packaged or partially packaged) for alignment checking at a much higher inspection speed (e.g., 100+ times faster) and a much higher spatial resolution (e.g., 0.24 microns) for the measurement at a lower cost than the traditional CT-based X-ray technologies.

Solder Bump Metrology Methods

Comparative Method Based on Edges Extraction

Figure 2A:
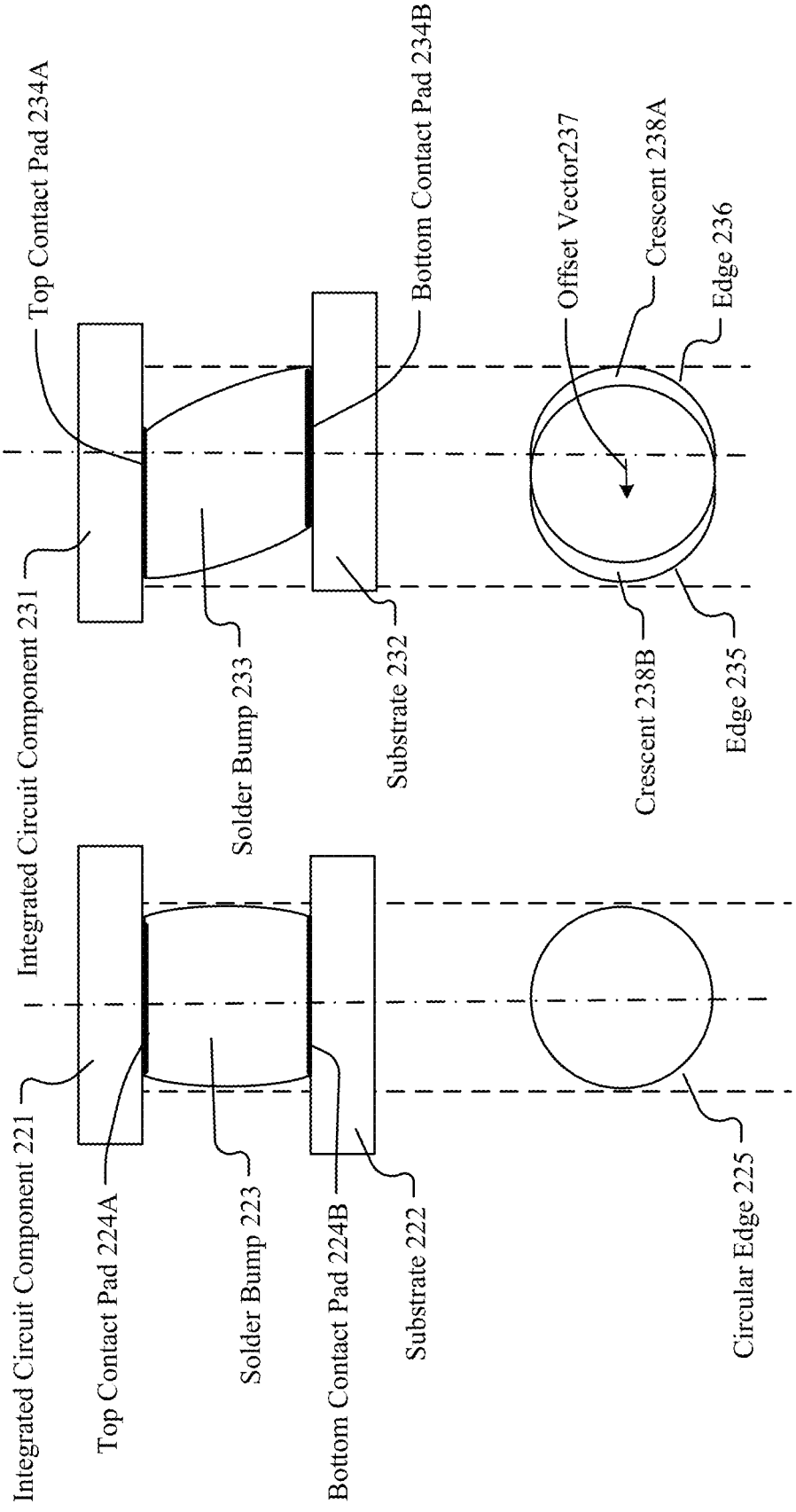
FIG. 2A illustrates an example process for determining metrology information of solder bumps based on edges of contacts pads.

FIG. 2A illustrates an example process 2000A for determining metrology information of solder bumps based on edges of contacts pads. In particular embodiments, the system may use one or more edge extraction algorithms (e.g., edge filters) to determine the edges of the top and bottom contact pads associated with the solder bumps. The geometric shape of a top contact pad edge may correspond to a cross-sectional shape of a top end of an associated solder bump. The geometric shape of a bottom contact pad edge may correspond to a cross-sectional shape of a bottom end of an associated solder bump. These cross-sectional shapes may be elliptical shapes or circular shapes. In particular embodiments, the system may use a combination of edge filters to process the X-ray image and determine areas corresponding to the "holes" (e.g., the areas having extra solder material and the area lacking solder material). In particular embodiments, by using the edge filters the system may have advantages in fitting elliptical shapes under heavy and varying background. In particular embodiments, the system may use one or more computer algorithms to determine the cross-sectional shapes of the inspected solder bump at the top and bottom contact pad planes based on the corresponding X-ray image. For example, the system may use one or more curve fitting algorithms to determine the cross-sectional shapes of the solder bump of interest at the top and bottom contact pad planes. For a simple device, a solder bump may be considered as a pillar, which may project in 2D (e.g., along the top-down direction) to a circle, or project to an ellipse with a particular angle. A shift of the top portion with respect to the bottom bump portion may project as two overlapped ellipses (or in 3D projection, and elongated bump). The system may determine the corresponding circle or ellipse, or ellipsoid (e.g., in a 3D space) and use these shapes to accurately measure the positioning and metrological parameters of the IC components.

As an example and not by way of limitation, the system may capture a top-down X-ray image for a solder bump 223 which connects the integrated circuit component 221 and the substrate 222 through the top contact pad 224A and bottom contact pad 224B. It is notable that in this disclosure, the term "top-down X-ray image" may refer to an X-ray image that is captured along a substantially perpendicular or orthogonal direction with respect to a plane of the inspected IC components (e.g., the die plane, the substrate plane, or the IC external surface plane, etc.). To generate a top-down X-ray image of an inspected sample, the system may generate an X-ray images of an inspected sample at a direction substantially orthogonal to a plane of the inspected sample. The system may use computer algorithms to extract the cross-sectional shapes of different portions of an element of interest in the inspected sample. For example, the system may use an edge filter to extract a first cross-section shape (e.g., an elliptical shape or circular shape) of a first portion (e.g., a top portion) of a solder bump in the inspected sample (e.g., an IC package). Then, the system may use the edge filter to extract a second cross-section shape (e.g., an elliptical shape or circular shape) of a second portion (e.g., a bottom portion) of the same solder bump in the inspected sample. The edge filter may extract or determine these cross-sectional shapes based on the grayscale values of the top-town X-ray image associated with the solder bump in the inspected sample. After that, the system may compare the first and the second cross-sectional shapes to determine one or more metrological parameters (e.g., an offset distance, an offset direction, a size, a relationship) associated with the element of interest and use these metrological parameters to detect defects in the inspected samples. For instance, the system may use one or more edge filter algorithms to process the captured top-down X-ray image to extract the circular edge 225 and determine the geometrical information (e.g., a size, a shape, a position, an edge gradient, etc.) of the circular edge 225. The system may determine whether the solder bump 223 is deformed (e.g., stretched, suppressed, twisted, misaligned, rotated, or pushed to side) by the mis-placement of the integrate circuit component 221 based on the geometric information of the circular edge 225. In this example, the system may determine whether the solder bump 223 is deformed by mis-placement of the integrated circuit component 221 based on the geometric shape and the size of the circular edge 225. In particular embodiments, the system may determine one or more crescent areas corresponding to one or more non-overlapping areas of the first cross-sectional shape and the second cross-sectional shape. The system may determine an offset vector based on the one or more crescent areas. The offset vector may be associated with an offset distance and an offset direction of the second portion of the first element of interest with respect to the first portion of the first element of interest. The one or more first metrological parameters may include the offset distance and the offset direction. As an example and not by way of limitation, the system may capture a top-down X-ray image for a solder bump 233 which connects the integrated circuit component 231 (e.g., corresponding to the first layer) and the substrate 232 (e.g., corresponding to the second layer) through the top contact pad 234A and bottom contact pad 234B. In this example, the integrated circuit 231 has been shifted to the left direction (e.g., an offset or misalignment) with respect to the substrate. As a result, the top contact pad 234A and the bottom contact pad 234B which are not aligned along the vertical direction may generate respective edges 235 and 236 in the X-ray image. The system may use one or more edge filter algorithms to process the captured top-down X-ray image to extract the shapes of the edges 235 and 236. Then, the system may determine the geometrical information (e.g., a size, a shape, a position, an edge gradient, etc.) of these edges 235 and 236. The edges 235 and 236 may have circular, elliptical, or other shapes depending on the deformation of the solder bump 233. The system may determine whether the solder bump 233 is deformed (e.g., stretched, suppressed, twisted, or pushed to side) by the mis-placement of the integrate circuit 231 based on the geometric information of the edges 235 and 236. In this example, the system may determine that the solder bump 233 has its top contact pad 234A being pushed to left direction based on the shapes and the sizes of the edges 235 and 236. The system may use the geometrical relationship to determine the offset distance and the direction for the offset 237 of the integrated circuit component 231. The system may determine the crescents 238A and 238B based on the shapes of the edges 235 and 236 and may determine an offset vector 237 based on the two crescents 238A and 238B. The offset vector 237 may indicate an offset or misalignment between the integrated circuit component 231 and the substrate 232.

Problems of Edge-Extraction Methods

In particular embodiments, the system may use the edge filters to process the X-ray images to effectively determine the edges of the solder bumps or corresponding contact pads. However, in some scenarios, it could be difficult for the edge filter to accurately determine the edges. For example, the X-ray images may have background noise and blurs in the edge areas and the edge filter may fail to extract the accurate edges from the X-ray images. Furthermore, the offset distance of the edges may be very small (e.g., corresponding to 2 or 3 pixels in the X-ray images) which makes it more difficult for the edge filters to accurately determine the edges in these scenarios. Therefore, the system may use edge filters when the X-ray images have relatively less background noise and blurs and when the offset distance is relatively large. When the X-ray images do have background noise or blurs or when the offset distance is relatively small, the system may use the comparative method based on reference images generated based on reference solder bumps (e.g., standard solder bumps with no deformation caused by mis-placement of the ICs), as will be described in later sections of this disclosure.

Subtraction Method Based on Reference Images a. Reference Images

Figure 3A:
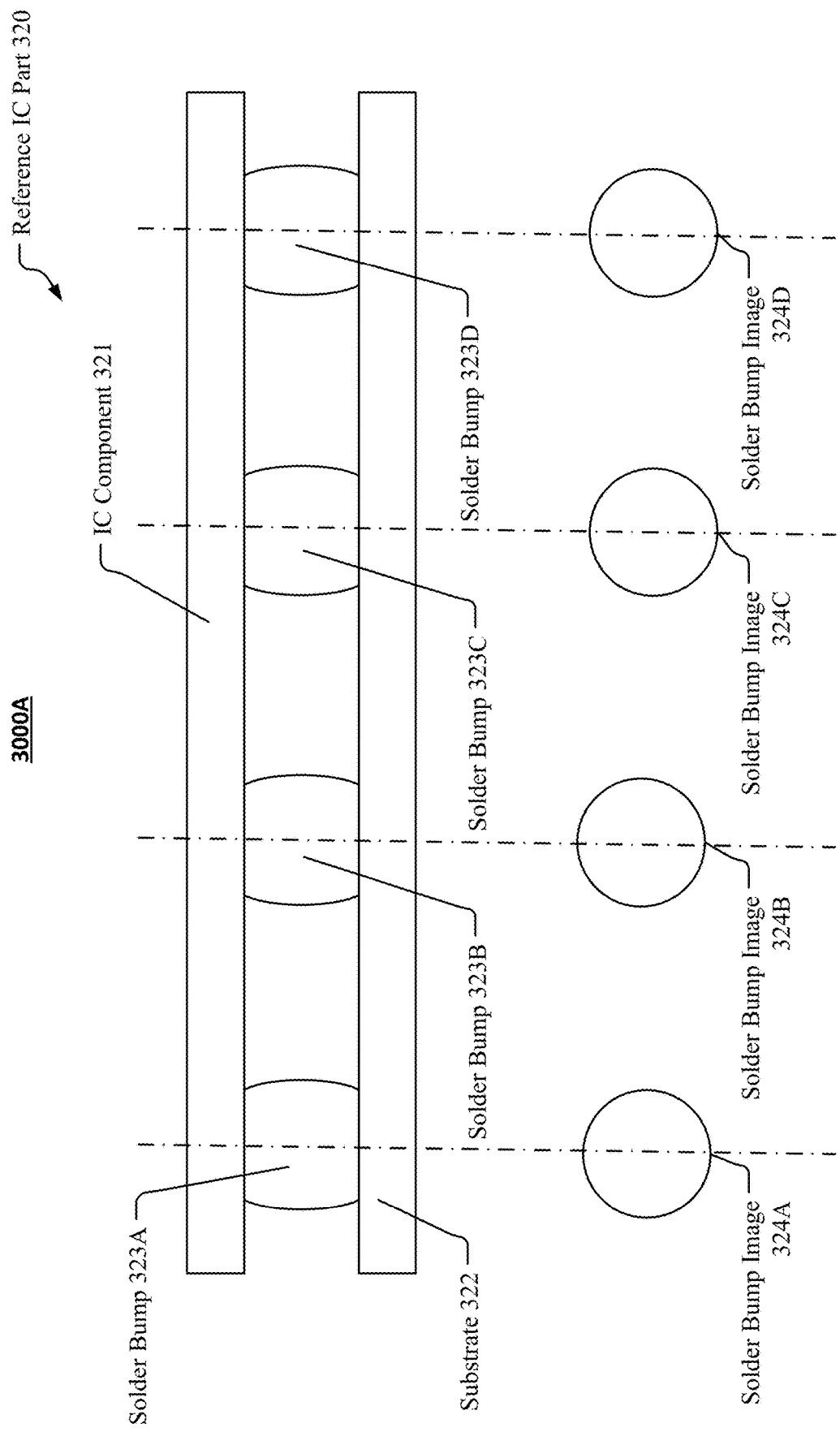
FIG. 3A illustrates an example process for generating a reference image based on a reference integrated circuit part.

In particular embodiments, the system may determine one or more reference images based on one or more reference parts including reference solder bumps. For example, the reference parts may be ICs that are considered as "standard" or "normal" without mis-placement of the IC components. The system may capture one or more X-ray images (e.g., top-down X-ray images or X-ray images captured from oblique directions) as the refence images which may be used as the ground truth for the inspected solder bumps (e.g., as illustrated in FIG. 3A). In particular embodiments, the system may generate one or more "synthetic" images as the reference images. For example, the system may generate a reference image by averaging a number of X-ray images of the same type of IC parts. The generated reference image may include a number of solder bump images which can be used as the reference solder bump images. As another example, the system may generate a reference image based on a theoretical calculation for what the standard or normal solder bump should be like.

b. Comparative Method Based on Reference Images

Figure 2B:
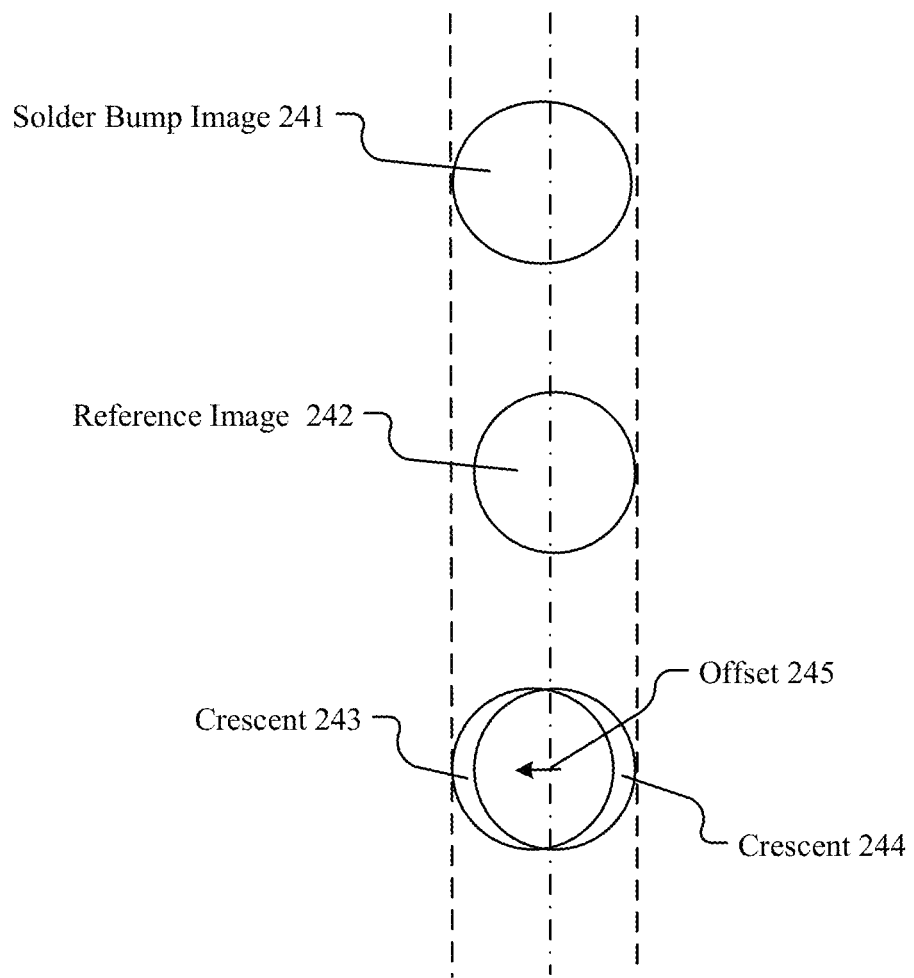
FIG. 2B illustrates an example process for determining metrology information of solder bumps using a comparative method based on reference images

FIG. 2B illustrates an example process 2000B for determining metrology information of solder bumps using a comparative method (e.g., a subtraction method or a comparison method) based on reference images. In particular embodiments, the system may align the captured X-ray image for the inspected IC part to a corresponding reference image (which is used as the ground truth). In the aligned images, the image of each solder bump may be aligned to a corresponding reference solder bump. Then, the system may subtract the reference image from the X-ray image of the inspected IC part. After that, the system may determine the metrology information of the solder bumps based on grayscale values of the residual pixels after the subtraction. In particular embodiments, the system may use a comparison method to measure the solder bump parameters. The system may use one or more computer algorithms to directly determine shape and size of the inspected solder bump based on the corresponding X-ray image. Then, the system may compare the determined bump shapes to the corresponding reference shapes (e.g., presented in reference images or theoretical shapes) to measure the offset. The refence shape may be represented by a reference image or a theoretical shape for what the standard solder bump should be.

As an example and not by way of limitation, the solder bump image 241 of a particular solder bump may be aligned to the reference image 242 for that particular solder bump. The system may subtract the refence image 242 from the solder bump image 241 corresponding to the same solder bump and determine two crescent areas 243 and 244 based on the residual pixels after the subtraction. The crescent 243 may correspond to an area where the solder bump has extract solder material with respect to the refence solder bump as represented by the reference image 242. The crescent 244 may correspond to an area where the solder bump lacks solder material with respect to the reference solder bump as represented by the reference image 242. The system may determine the two crescent areas by integrating the grayscale values of the residual pixels after the subtraction. Then, the system may calculate the offset distance and direction for the offset 245. The offset direction may be the direction from the crescent 244, which corresponds to the area lacking solder material, to the crescent 243, which corresponds to the area having the extra solder material. In particular embodiments, the system may determine the distance of shift d from the area of the crescent compared to a circle using the following equation:

$$d = 1 - \left(\frac{2}{pi}\right) \cdot \cos^{-1}\left(\frac{a}{2r}\right) + \left(\frac{2}{pi}\right) \cdot a \cdot (1 - (a/2r)^2)^{\frac{1}{2}} \approx \frac{2}{pi} \cdot a/r \quad (1)$$

where, d is the scaled offset distance, r is the circle radius, a is the measured area of the crescent. Thus, the system may determine the crescent area by integrating the grayscale values of the residual pixels and determine the offset distance and direction for the offset 245 based on the crescent areas. The offset 235 may correspond to the offset of the shifted IC component with respect to the substrate. As a result, the system may determine the mis-placement information of the IC components based on the X-ray images of the solder bumps. Since the crescent areas are determined by accumulative integrating operation of the residual grayscale values, the comparative method may provide a higher sensitivity than the methods based on the edge comparison, and are capable of measuring shift distance smaller than the X-ray image pixel size.

c. Example Measurement Data

Figure 2C:
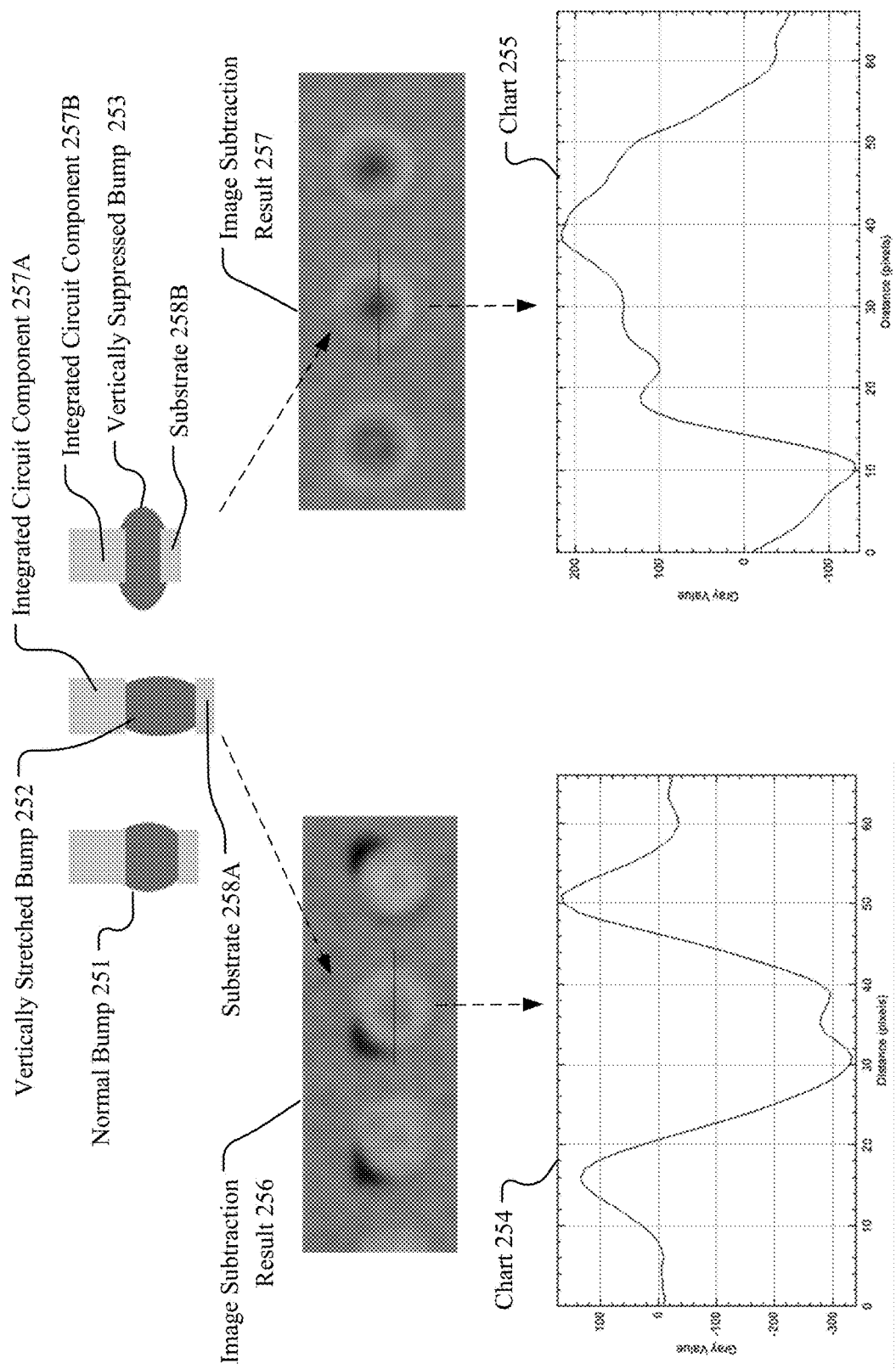
FIG. 2C illustrates example measurement signals for vertically stretched bump and vertically suppressed bump.

FIG. 2C illustrates example measurement signals (e.g., 254 and 255) for vertically stretched bump 252 and vertically suppressed bump 253. As an example and not by way of limitation, a normal bump 251, a vertically stretched bump 252, and a vertically suppressed bump 253 are illustrated in FIG. 2C. The vertically stretched bump 252 may have a height that is greater (e.g., +3 μm) than the normal bump 251. This could be caused by a vertical offset (e.g., +3 μm) of the IC component 257A with respect to the substrate 258A or this could be caused by a height (thickness) variation of the IC component 257A or the substrate 258A. The vertically suppressed bump 253 may have a height that is smaller than (e.g., −3 μm) the normal bump 251. This could be caused by a vertical offset (e.g., −3 μm) of the IC component 257B with respect to the substrate 258B or this could be caused by a height (thickness) variation of the IC component 257B or the substrate 258B. In particular embodiments, the system may capture the top-down X-ray image of the normal bump 251 and use that top-down X-ray image as the refence image. Then, the system may capture the top-down X-ray images of the vertically stretch bump 252 and the vertically suppressed bump 253. After that, the system may subtract the reference image from the X-ray images of the vertically stretched bumps 252 and 253, respectively. For the vertically stretched bump 252, the image subtraction result may be shown in image 256. For the vertical stretched bump 253, the image subtraction result may be shown in image 257. The charts 254 and 255 show the example gray value profiles for the vertically stretched bump 252 and the vertically suppressed bump 253. These example gray value profiles in the chats 254 and 255 may correspond to a cross section profile of the respective image subtraction results 256 and 257 (e.g., as determined along a horizontal cross-section line as shown in FIG. 2C).

As illustrated in FIG. 2C, comparing to the normal bump 251, the vertically stretched bump 252 may have more solder material in the center portion of the bump, less solder material in the edge portion of the bump, and a narrower gray value profile. These characteristics could be determined based on the image subtraction result 256 and the corresponding cross-section gray value profile in the chart 254. Comparing to the normal bump 251, the vertically suppressed bump 253 may have less solder material in the center portion of the bump, more solder material in the edge portion of the bump, and a wider gray value profile. These characteristics could be determined based on the image subtraction result 257 and the corresponding cross-section gray value profile in the chart 255. It is notable that in the charts 254 and 257, the gray values may correspond to the subtraction results of corresponding gray values of the refence image and images of the inspected solder bump. Gray values or grayscale values in an X-ray image may be inversely proportional to the absorption of the X-ray and therefore the thickness of the solder material. In particular embodiments, the system may have a measurement resolution down to 0.24 μm for the dimensions (e.g., diameters) of the inspected solder bump or the shift distances (e.g., offset distance) of the IC components. In particular embodiments, the system may have a measurement resolution down to 0.5 μm for the dimensions (e.g., diameters) of the inspected solder bump or the shift distances (e.g., offset distance) of the IC components. In particular embodiments, the measurement signals may have up to 100 grey levels difference in the center portion of the inspected solder bump.

d. Example X-Ray Images with Measurement Results

Figure 2D:
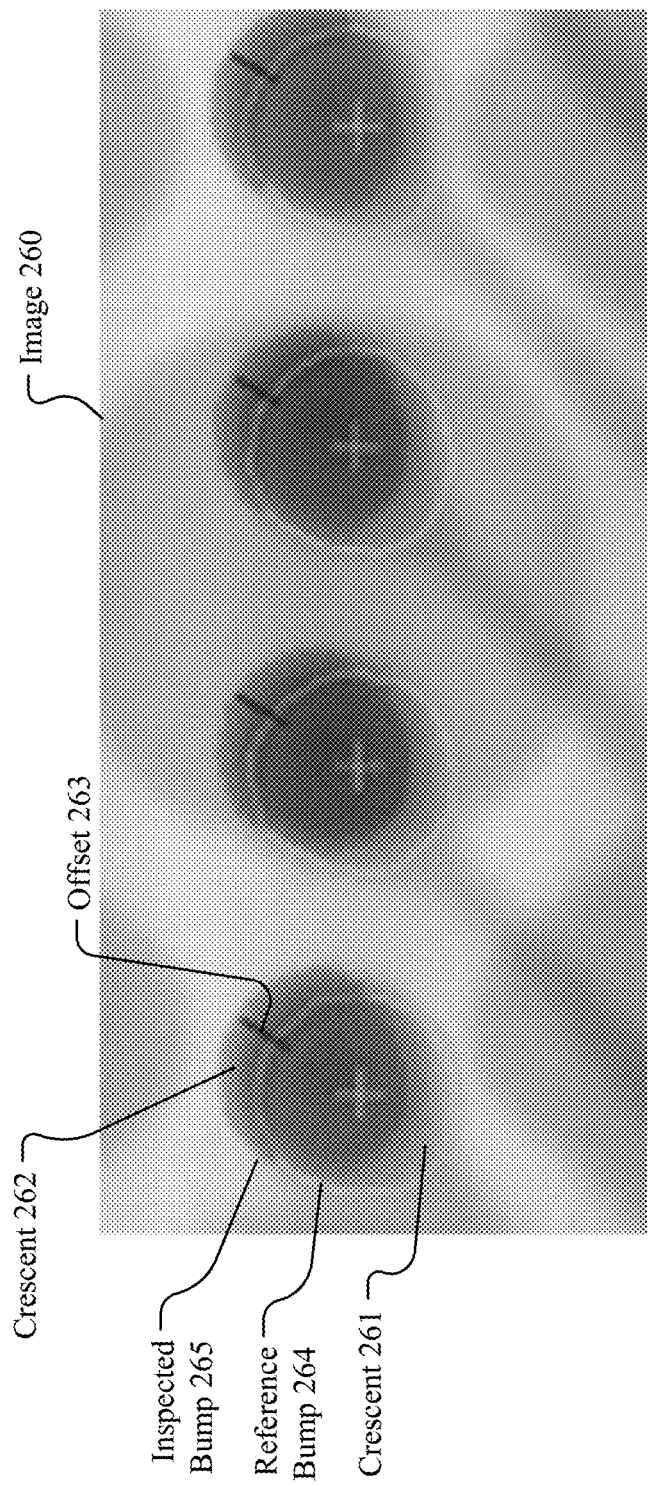
FIG. 2D illustrates an example X-ray image for solder bumps of a shifted integrated circuit component.

FIG. 2D illustrates an example X-ray image 260 for solder bumps of a shifted integrated circuit component. As an example and not by way of limitation, the system may capture a top-down X-ray image of the inspected IC part and process the X-ray image using the subtraction method (or a comparison method) based on reference image as described in this disclosure. The processing results may be overlaid on the X-ray image as illustrated in the image 260. The circular mark 264 may correspond to the reference bump shape. The dark circular area 265 may correspond to the inspected bump. By comparing the shape of the inspected solder bump 265 and the reference bump 264 (e.g., using a subtraction method or a comparison method), the system may determine a first crescent area 261 which corresponds to the area where the solder material is shifted away (i.e., lack of solder material) in the inspected solder bump 265 comparing to the reference bump 264. The system may determine a second crescent area 262 which corresponds to the area where the solder material is pushed into (e.g., having extra solder material) comparing the refence bump 264. Then, the system may determine the offset direction and offset distance for the offset of the 263 based on the two crescents 261 and 262. The offset direction may be along a direction point from the first crescent 261 corresponding the area lacking solder material to the second crescent 262 corresponding to the area having extra solder material. The offset distance may be calculated based on the geometric relations (e.g., Equation (1)) of the two crescents 261 and 262.

In particular embodiments, the system may measure the offset or shift distance of the corresponding IC component associated with the inspected solder bumps by averaging the offset vectors of the inspected solder bumps. In particular embodiments, the system may determine the shapes and the areas of the crescents 261 and 262 by integrating the gray values of the residual pixels of the subtraction results (e.g., using the reference image). In particular embodiments, the system may determine the shapes and areas of the crescents 261 and 262 by directly comparing the reference bumps (e.g., shape, size) to corresponding inspected solder bumps. In particular embodiments, the system could accurately measure the measure elliptic axis, the crescent major axis, or any related parameters of the inspected solder bumps.

Measure IC Placement Parameters

Measurement Parameters Overview a. Solder Bump Metrology Parameters

In particular embodiments, to measure the placement parameters or any metrological parameters of the IC components (e.g., a tilt, a shift, a rotation, or a mis-position offset of a wafer in an IC part), the system may measure a number of parameters associated with the inspected solder bumps including, for example, but not limited to, a diameter, a diameter difference with respect to the reference solder bump, a central height, a central height difference with respect the reference solder bump, an edge height, an edge height difference with respect to the refence solder bump, a position of the solder bump (e.g., a center position), a position difference with respect to the reference solder bump, an ellipsoidal major axis, a difference of the ellipsoidal major axis with respect to the reference solder bump, a height along the major axis, a height difference along the major axis with respect to the reference solder bump, a total area of the solder bump top-down projection, a total area difference of the solder bump top-down projection with respect to the reference solder bump, etc. In particular embodiments, the system may measure these parameters by directly using computer algorithm to process a single top-down X-ray image (e.g., based on the cross-sectional shapes of solder bumps as determined using edge filters). In particular embodiments, the system may measure these parameters based on a comparative metrology (e.g., a subtraction method or a comparison method) by comparing the X-ray image of the inspected IC part to a reference image. In particular embodiments, the system may measure these parameters based on two or more X-ray image captured from different angles (e.g., top-down or oblique angles).

b. IC Component Placement Parameters

In particular embodiments, the system may measure the placement parameters (e.g., positions, mis-placement parameters, alignment parameters) of the IC components (e.g., die or wafer) with respect to the corresponding substrates based on the metrology information of the associated solder bumps. In particular embodiments, the system may measure one or more parameters related to a tilt, a shift, a rotation, a height variation of the inspected IC components (e.g., dies or wafers). As an example and not by way of limitation, the system may measure the tilt angle and tilt direction of a die with respect to a substrate to which the die is bonded through one or more solder bumps. As another example and not by way limitation, the system may measure the shift distance and shift direction of a die with respect to a substrate to which the die is bonded through one or more solder bumps. As another example and not by way of limitation, the system may measure the rotation angle and rotation direction (e.g., in a plane parallel to the substrate plane) of a die with respect to a substrate to which the die is bonded through one or more solder bumps. As another example and not by way of limitation, the system may measure the position offset distance (e.g., in the perpendicular direction with respect to the substrate plane) of a die with respect to a substrate to which the die is bonded through one or more solder bumps.

Measurement Process a. Standard IC Part and Reference Image Generation

FIG. 3A illustrates an example process 3000A for generating a reference image based on a reference integrated circuit part. As an example and not by way of limitation, the system may inspect a reference IC part 320 which is considered as a "standard" or "normal" IC part (e.g., without mis-placement of the IC components). The reference IC part 320 may include an IC component 321 which is bonded to a substrate 322 through a number of solder bumps (e.g., 323A, 323B, 323C, 323D) with corresponding connection pins (not shown). These solder bumps may be considered as the standard or ideal solder bumps for the correctly placed and accurately aligned IC component 321. The system may capture a top-down X-ray image (e.g., or an X-ray image at an oblique angle) of the reference IC part 320 and use that X-ray as the refence image for inspecting the same types of IC parts. The reference image may include a reference solder bump image (e.g., 324A, 324B, 324C, 324D) for each of the solder bumps (e.g., 323A, 323B, 323C, 323D) in the reference IC part 320. These reference solder bump images may be used as the ground truth for the inspected corresponding solder bumps of the same type of IC parts.

In particular embodiments, instead of using a reference part to generate the refence image, the system may generate one or more "synthetic" images as the reference images. For example, the system may generate a reference by averaging a number of X-ray images of the same type of IC parts. The generated reference image may include a number of solder bump images which can be used as the reference solder bump images. As another example, the system may generate (e.g., compose or synthesize) a reference image based on a theoretical calculation for what the standard or normal solder bump should be. As another example, the system may generate a reference image for a type of IC parts based on a combination of the top-down image of the reference part and the theoretical calculation for what the ideal solder pump should be.

b. Differentiate Different Types of Mis-Placement

In particular embodiments, the system may determine the placement or mis-placement parameters of IC components of the inspected IC parts based on the metrology information of the associated solder bumps. For example, the system may use the comparative method to measure the metrology parameters of the solder bumps of the inspected IC part. Then, the system may analyze the measurement results of the comparative method (e.g., the residual patterns of the image subtraction results) to determine whether the IC component is mis-placed (e.g., shifted, tilted, rotated, or positioned with a vertical offset) with respect to the corresponding substrate. In response to a determination that the IC component is mis-placed, the system may analyze the metrology parameters of multiple solder bumps to determine the type of mis-placement (e.g., shifted, tilted, rotated, or positioned with a vertical offset). For example, the system may determine the types of mis-placement based on the similarity and difference between the inspected solder bumps, as described in later sections of this disclosure. In particular embodiments, the term "residual pattern" may refer to a pattern generated by subtracting a reference image from an X-ray image of an element of interest in the inspected sample or a pattern generated by subtracting or comparing two geometric shapes of interest (e.g., two cross-sectional shapes corresponding to the top or bottom ends of a solder bump of interest).

c. Measure Shifted Distance and Direction

Figure 3B:
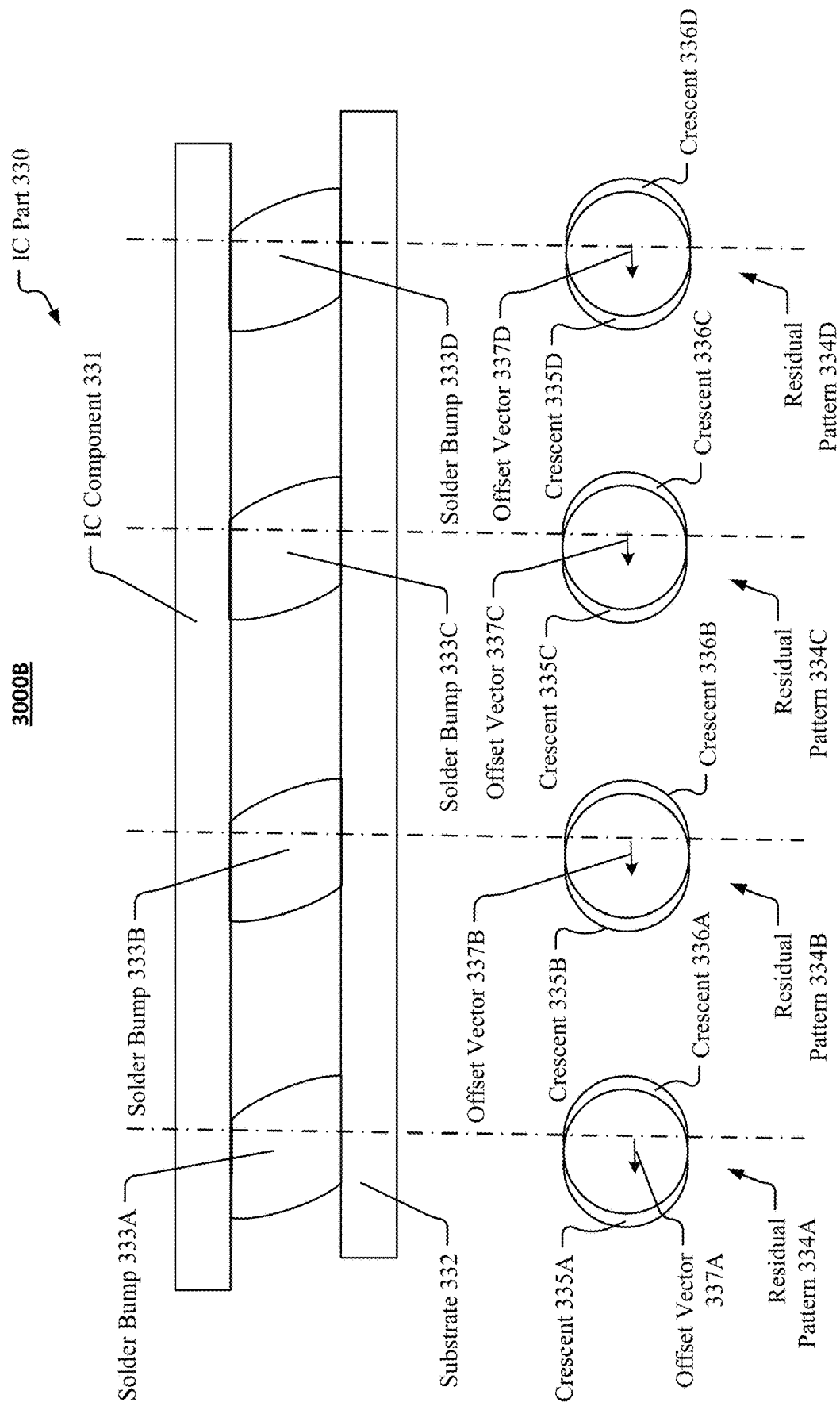
FIG. 3B illustrates an example process for measuring parameters associated with a shifted integrated circuit component.

FIG. 3B illustrates an example process 3000B for measuring parameters associated with a shifted integrated circuit component. In particular embodiments, the system may determine one or more first metrological parameters associated with a first element of interest in the inspected sample based a comparison of a first cross-sectional shape of a first portion of the first element of interest and a second cross-sectional shape of a second portion of the first element of interest. Then, the system may determine one or more second metrological parameters associated with a second element of interest in the inspected sample based a comparison of a third cross-sectional shape of a third portion of the second element of interest and a fourth cross-sectional shape of a fourth portion of the second element of interest. The one or more first metrological parameters may include first size parameters of the first cross-sectional shape and the second cross-sectional shape of the first element of interest. The one or more second metrological parameters may include second size parameters of the third cross-sectional shape and the fourth cross-sectional shape of the second element of interest. The system may determine an offset vector (with an offset direction and an offset distance) for a first layer of the inspected sample with respect to a second layer of the inspected sample based on the first size parameters associated with the first element of interest and the second size parameters associated with the second element of interest. As an example and not by way of limitation, for an IC part 330 which includes an IC component 331 that is shifted to one side with respect to the substrate 332, the system may compare the two cross-sectional shapes to determine the accent patterns of 335A, 355B, 355C, 355D, 336A, 336B, 336C, and 336D and determine the residual patterns 334A, 334B, 334C, and 334D (e.g., by subtracting or comparing cross-sectional shapes of top and bottom ends of the solder bumps). The system may determine that each residual pattern (e.g., 334A, 334B, 334C, and 334D) has a first crescent (e.g., 335A, 335B, 335C, and 335D) on one side and a second crescent (e.g., 336A, 336B, 336C, and 336D) on the other side. The system may determine the offset vectors 337A, 337B, 337C, and 337D and compare these offset vectors to each other. In this example, the system may determine the solder bumps are deformed by the IC component 331 uniformly by a shift type mis-placement based on the comparison of these offset vectors. In particular embodiments, instead of comparing the two cross-sectional shapes of the different portions of the solder bumps, the system may compare the X-ray image of the solder bumps of interest to respective reference images. The system may determine the residual patterns 334A, 334B, 334C, and 334D by subtracting reference images from respective X-ray images of respective solder bumps. As an example and not by way of limitation, for an IC part 330 which includes an IC component 331 that is shifted to one side with respect to the substrate 332, the system may use the comparative method to determine the residual patterns 334A, 334B, 334C, and 334D based on the image subtraction results (e.g., by subtracting the reference image from the X-ray image of the inspected IC part 330). In this example, the system may analyze these residual patterns 334A, 334B, 334C, and 334D to determine that: (1) each residual pattern has a first crescent (e.g., 335A, 335B, 335C, and 335D) on one side and a second crescent (e.g., 336A, 336B, 336C, and 336D) on the other side, and (2) the residual patterns 334A, 334B, 334C, and 334D are substantially the same to each other. The system may determine that the solder bumps are deformed by the IC component 331 uniformly by a shift type mis-placement.

Then, particular embodiments of the system may use determine an offset distance and offset direction based on the image residual pattern of each solder bump. The system may determine the offset vectors 337A, 337B, 337C, and 337D and compare these offset vectors to each other. For example, for the solder bump 333A, the system may determine that the crescent 335A corresponds to an area having extra solder material with respect to the ideal solder bump and the crescent 336A corresponds to an area lacking solder material with respect to the ideal solder bump. The system may determine an offset vector 337A which has a direction pointing from the crescent 336A to 335A. The system may determine the offset vector length corresponding to the shift distance using Equation (1). The system may determine an offset set vector (e.g., 337A, 337B, 337C, 337D) based on the metrology information of each of the solder bumps (e.g., 333A, 333B, 333C, 333D) and determine an offset vector (including a offset distance and a offset direction) for the IC component 331 by averaging offset vectors determined based on each solder bump across the inspected IC part. In particular embodiments, the system may determine an offset distance and offset direction for an associated joint based on the metrological parameters of a single solder bumps associated with that joint or metrological parameters of multiple solder bumps associated with that joint.

d. Two Comparative Methods

Figure 3C:
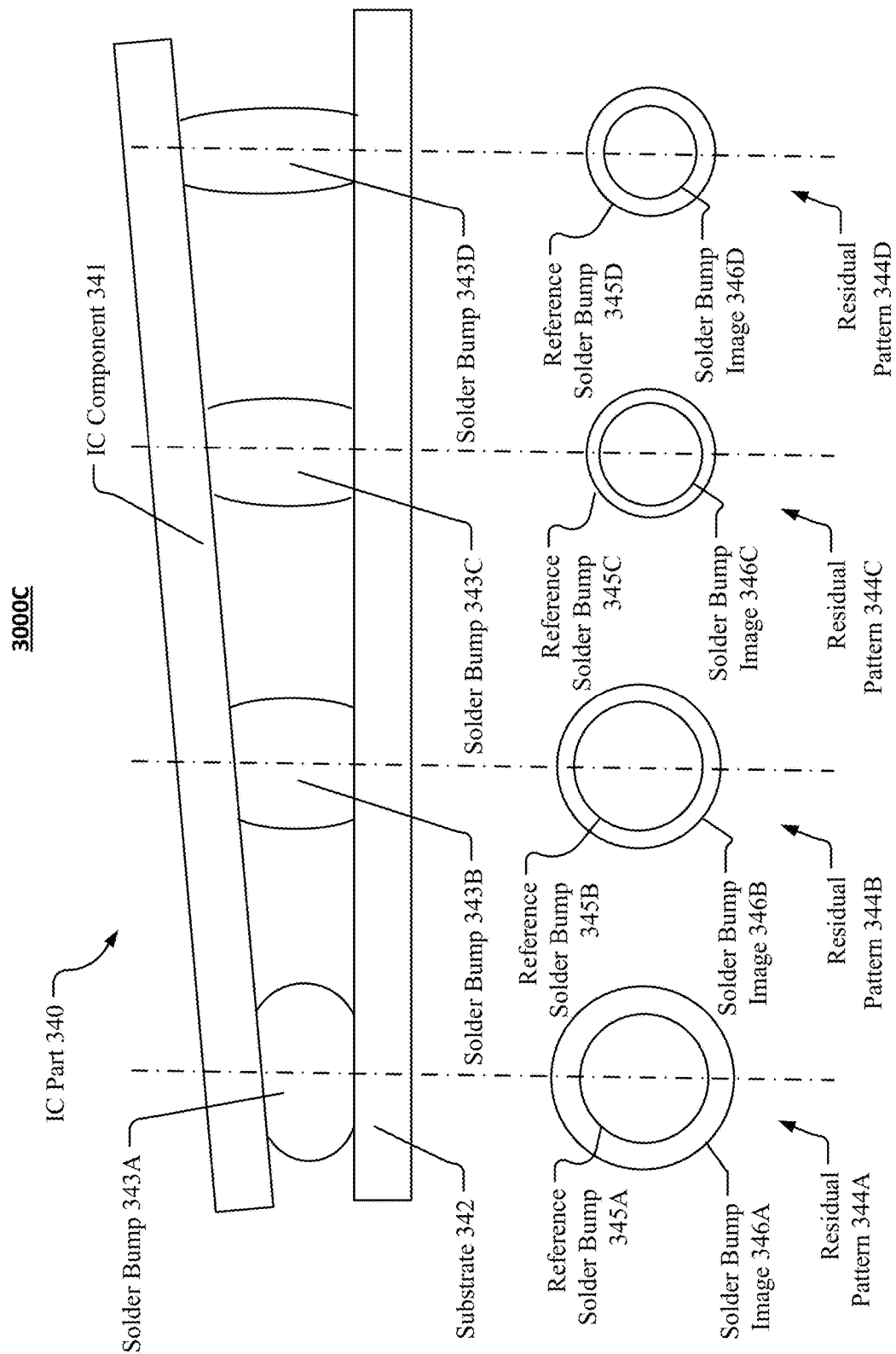
FIG. 3C illustrates an example process for measuring parameters associated with a tilted integrated circuit component.
Figure 3D:
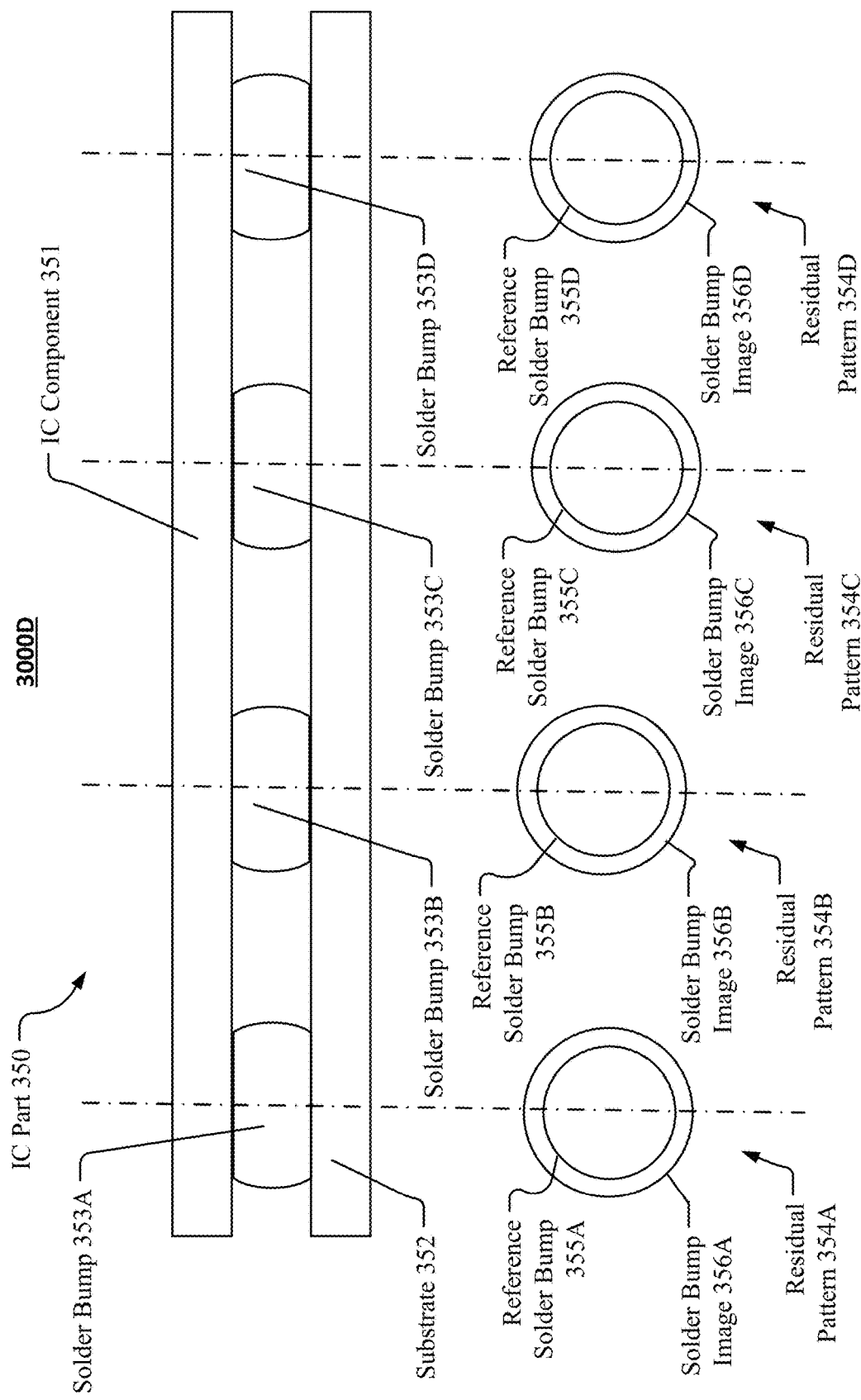
FIG. 3D illustrates example processes for measuring parameters associated with an integrated circuit component which has a negative vertical offset.
Figure 3E:
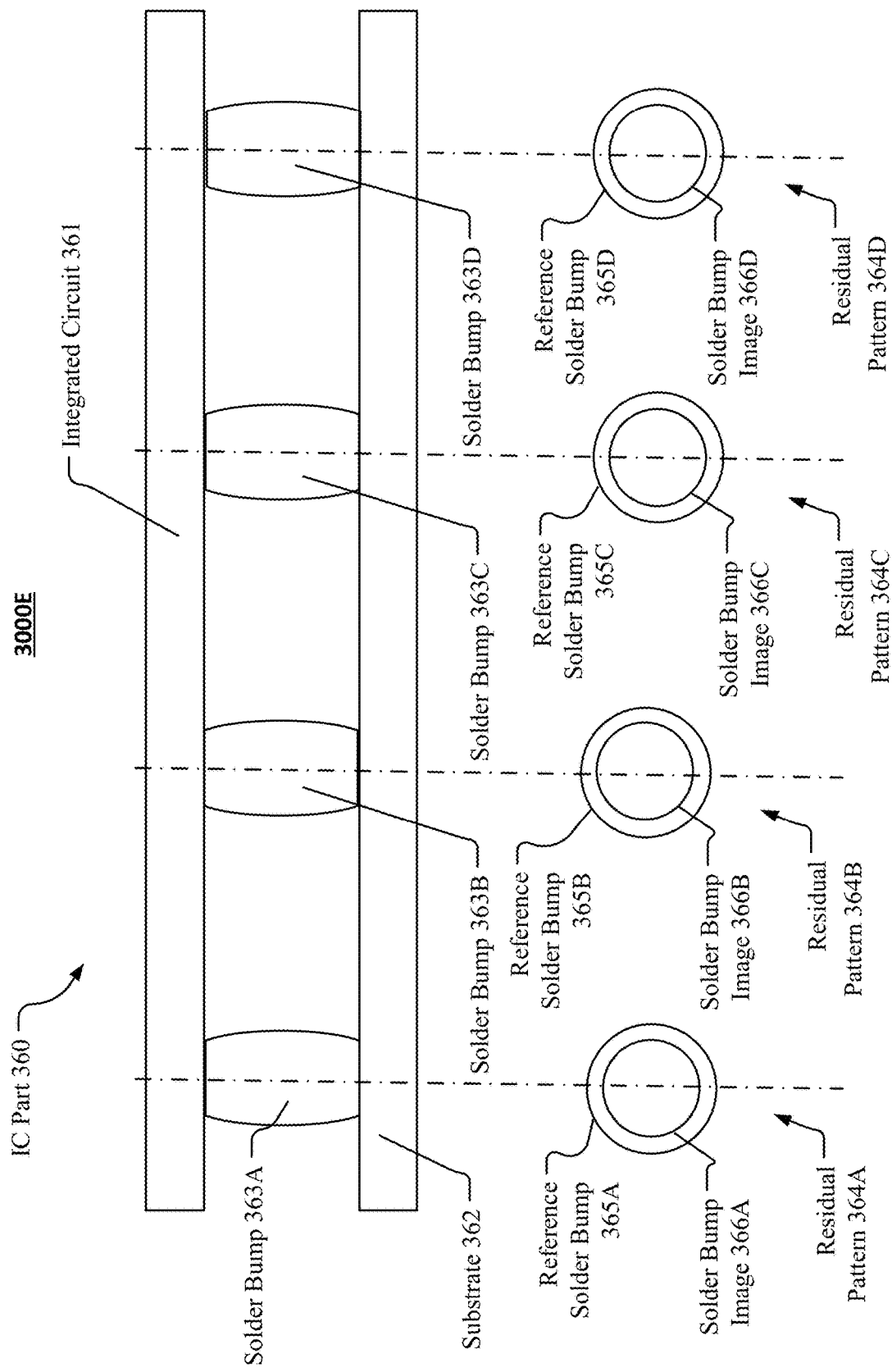
FIG. 3E illustrates example processes for measuring parameters associated with an integrated circuit component which has a positive vertical offset.
Figure 3F:
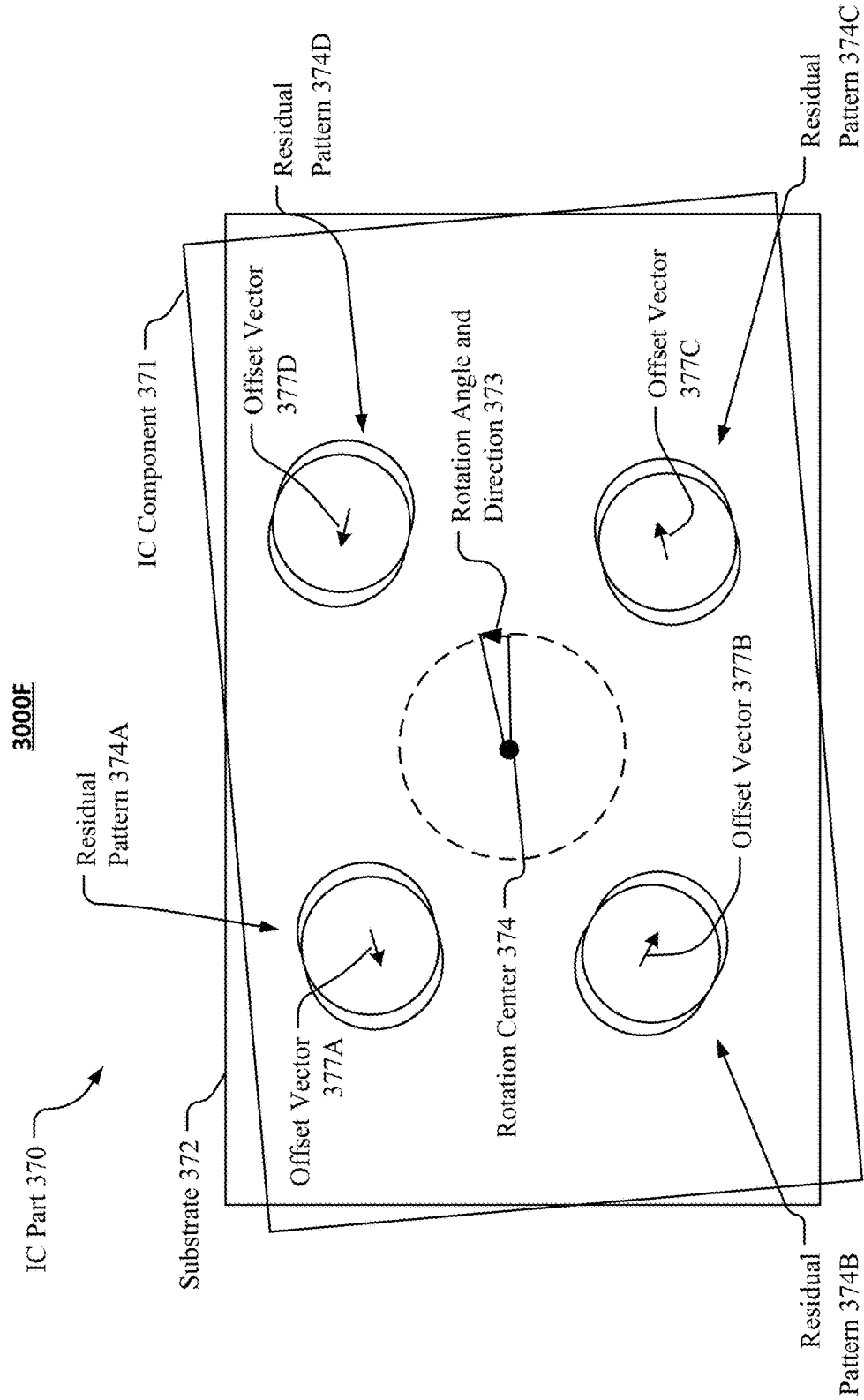
FIG. 3F illustrates an example process for measuring parameters associated with a rotated integrated circuit component with respect to the substrate.

In particular embodiments, the system may use a first comparative method to determine a residual pattern by subtracting or comparing the two cross-sectional shapes of the top and bottom ends of a solder bump of interest. In particular embodiments, the system may use a second comparative method to determine a residual pattern by subtracting a reference image from the X-ray image of the element of interest in the inspected sample. For some scenarios such as measuring a layer offset or a rotation angle (as shown in FIGS. 3B and 3F), the first comparative method based on the comparison of two or more cross-sectional shapes may be more effective than or as effective as the second comparative method based reference images. For some other scenarios such as measuring a tilting angle or a vertical offset (e.g., as shown in FIGS. 3C-3E), the second comparative method based reference images may be more effective because the measurement uses on the size parameters and the reference images may provide a baseline for these size parameters. However, the first comparative method based on the comparison of two or more cross-sectional shapes may be used in the scenarios as shown in FIGS. 3C-3E and provide effective and accurate measurement results. The examples as illustrated in FIGS. 3A-3F may be used to explain the principles and measurement processes of both of the first comparative method based on the comparison of two or more cross-sectional shapes and the second comparative method based on reference images.

e. Measure Tilted Direction and Angle

FIG. 3C illustrates an example process 3000C for measuring parameters associated with a tilted integrated circuit component. In particular embodiments, the system may use the first comparative method to determine a residual pattern by subtracting or comparing the two cross-sectional shapes of the top and bottom ends of a solder bump of interest. In particular embodiments, the system may use the second comparative method to determine a residual pattern by subtracting a reference image from the X-ray image of the element of interest in the inspected sample. The system may determine a tilting angle of a first layer of the inspected sample with respect to a second layer of the inspected sample based on first size parameters associated with a first element of interest and second size parameters associated with a second element of interest. In particular embodiments, the system may generate a reference X-ray image for the inspected sample. The system may determine one or more first metrological parameters of the element of interest based on a comparison of the X-ray image of the inspected sample and the reference X-ray image. In particular embodiments, the reference X-ray image may be generated based on an average of X-ray images of a number of reference samples that are the same type of samples to the inspected sample. In particular embodiments, the reference X-ray image may be generated based on a standard reference sample for the inspected sample. The system may determine one or more residual patterns by subtracting the reference X-ray image from the X-ray image of the inspected sample. The one or more first metrological parameters may be determined based on the one or more residual patterns. The one or more residual patterns may include one or more crescent areas corresponding to one or more non-overlapping areas of an image area in the X-ray image corresponding the first element of interest and a reference image area in the reference X-ray image corresponding to a reference element of interest. As an example and nob by way of limitation, for an IC part 340 which includes an IC component 341 that is tilted with respect to the substrate 342, the system may use the second comparative method to determine the residual patterns 344A, 344B, 344C, and 344D based on the image subtraction results (e.g., by subtracting the reference image from the X-ray image of the inspected IC part 340). The system may analyze these residual patterns 344A, 344B, 344C, and 344D to determine that: (1) the residual patterns 344A, 344B, 344C, and 344D of the image subtraction results all have a similar ring shape; (2) the size (e.g., diameter) of the solder bumps vary monotonously along the substrate plane with the largest size on the left end and smallest size on the right end. For example, the system may determine that the solder bump 343D is higher than the solder bump 343C based on a determination that the circular shape of the solder bump image 346D has a smaller diameter than the circular shape of the solder bump image 346C. As another example, the system may determine that the solder bump 343C is higher than the solder bump 343B based on a determination that the circular shape of the solder bump image 346C has a smaller diameter than the circular shape of the solder bump image 346B. As another example, the system may determine that the solder bump 343B is higher than the solder bump 343A based on a determination that the circular shape of the solder bump image 346B has a smaller diameter than the circular shape of the solder bump image 346A.

In particular embodiments, the system may also determine the relative height of the solder bumps with respect to the corresponding ideal solder bumps by comparing their circular shape diameter in the X-ray images to the corresponding ideal solder bumps. As an example, the system may determine that solder bump 343C and 343D have greater heights than the corresponding ideal solder bumps because their circular shapes in the X-ray images are smaller than the corresponding reference bumps. As another example, the system may determine that solder bump 343A and 343B have smaller heights than the corresponding ideal solder bumps because their circular shapes in the X-ray images are greater than the corresponding reference bumps. The system may determine the solder bumps are deformed by the IC component 331 with a tilt type mis-placement and the left end of the IC component 341 is closer to the substrate than the right end of the IC component 341. In particular embodiments, the system may determine the height for each of the solder bumps 343A, 343B, 343C, and 343D based on the corresponding residual patterns 344A, 344B, 344C, and 344D. For example, the system may assume all solder bump have the same solder material volume and use the volume value to calculate the solder bump height for a particular solder bump (e.g., 343A) based on the diameter of the solder bump image 346A. The solder bump height may be calculated based on theoretical 3D models of the ideal solder bumps and deformed solder bump. The system may determine the height of each of the solder bump (e.g., 343A, 343B, 343C, and 343D) and calculate the tilt angle of the IC component 341 with respect to the substrate 342 based on the measured solder bump heights.

f. Measure Height Variation

In particular embodiments, the system may a process that is similar to the process for measuring the tilted direction and angle to measure the parameters associated with an IC component having a variable height or thickness. For example, a tilted die may deform the associated solder bumps according to a pattern (e.g., a linear change pattern) corresponding the tilt direction and tilt angle. A die with a variable height or thickness may deform the associated solder bumps based on its height profiles. Therefore, the system may use the same process as used for measuring the tilt angle and direction to measure the height variation. As an example and not by way of limitation, the system may determine the height of each solder bumps and aggregate all the determined heights to determine a height variation profile of an IC die. Depending on the spatial distribution of the solder bumps, the determine height variation profile of the IC die may be a one dimensional profile or a two dimensional profile.

g. Measure Vertical Position Offsets

FIG. 3D illustrates example processes 3000D for measuring parameters associated with an integrated circuit component which has a negative vertical offset. In particular embodiments, the system may determine a layer-distance offset of a first layer (e.g., the IC component 351) of the inspected sample with respect to a second layer (e.g., the substrate 352) of the inspected sample by comparing the size parameters of different elements of interest (e.g., solder bumps). For example, the system may determine the layer-distance offset of the IC component 352 with respect to the substrate 352 based on first size parameters associated with a first element of interest (e.g., the solder bump 353A) and second size parameters associated with a second element of interest (e.g., the solder bump of 353B, 353C, or 353D). As an example and not by way of limitation, the system may inspect an IC part 350 which includes an IC component 351 bonded to a substrate 352 through a number of solder bumps 353A, 353B, 353C, and 353D and corresponding connection pins (not shown). The IC component 351 may be mis-placed at a vertical position that is offset from the ideal vertical position. As a result, the solder bumps 353A, 353B, 353C, and 353D are suppressed by the mis-placed IC component 351 and may have smaller heights than the corresponding ideal solder bumps. The system may use the comparative method based on reference images to determine the residual patterns 354A, 354B, 354C, and 354D (e.g., by subtracting the reference image from the X-ray image of the inspected IC part 350). The system may determine that: (1) the residual patterns of the all the solder bumps have substantially the same ring shape with substantially the same size, and (2) the circular shapes in corresponding solder bump images (e.g., 356A, 356B, 356C, and 356D) have greater diameters that corresponding ideal solder bumps. The system may determine that the solder bumps 353A, 353B, 353C, and 353D have substantially the same height and their heights are smaller than the corresponding ideal solder bumps. As a result, the system may determine that the solder bumps 353A, 353B, 353C, and 353D have been deformed by the mis-placed IC component having a negative vertical offset (i.e., closer to the substrate along the vertical direction than the ideal position). The system may determine the height for each of the solder bumps 353A, 353B, 353C, and 353D based on their circular shapes and sizes in the residual patterns 354A, 354B, 354C, and 354D assuming all solder bumps have the same volume with respect to the corresponding ideal solder bumps. Then, the system may determine the negative offset value of the IC component 351 along the vertical direction based on an average height of all the solder bumps 353A, 353B, 353C, and 353D and the ideal height of the ideal solder bumps.

FIG. 3E illustrates example processes 3000E for measuring parameters associated with an integrated circuit component which has a positive vertical offset. As an example and not by way of limitation, the system may inspect an IC part 360 which includes an IC component 361 bonded to a substrate 362 through a number of solder bumps 363A, 363B, 363C, and 363D and corresponding connection pins (not shown). The IC component 361 may be mis-placed at a vertical position that is offset from the ideal vertical position. As a result, the solder bumps 363A, 363B, 363C, and 363D are stretched by the mis-placed IC component 361 and may have greater heights than the corresponding ideal solder bumps. The system may use the comparative method to determine the residual patterns 364A, 364B, 364C, and 364D (e.g., by subtracting the reference image from the X-ray image of the inspected IC part 360). The system may determine that: (1) the residual patterns of the all the solder bumps have substantially the same ring shape with substantially the same size, and (2) the circular shapes in corresponding solder bump images (e.g., 366A, 366B, 366C, and 366D) have smaller diameters that corresponding ideal solder bumps. The system may determine that the solder bumps 363A, 363B, 363C, and 363D have substantially the same height and their height is greater than the corresponding ideal solder bumps. As a result, the system may determine that the solder bumps 363A, 363B, 363C, and 363D have been deformed by the mis-placed IC component having a positive vertical offset (i.e., farer to the substrate along the vertical direction than the ideal position). The system may determine the height for each of the solder bumps 363A, 363B, 363C, and 363D based on their circular shapes and sizes in the residual patterns 364A, 364B, 364C, and 364D assuming all solder bumps have the same volume with respect to the corresponding ideal solder bumps. Then, the system may determine the positive offset value of the IC component 361 along the vertical direction based on an average height of all the solder bumps 363A, 363B, 363C, and 363D and the ideal height of ideal solder bumps.

h. Measure Rotation Angle and Direction

FIG. 3F illustrates an example process 3000F for measuring parameters associated with a rotated integrated circuit component with respect to the substrate. In particular embodiments, the system may determine an offset distance and direction for one or more of the inspected solder bumps based on the measured metrology parameters of that solder bumps. Then, the system may determine the rotation angle and rotation direction of an associated die by aggregating the shift distances and directions of all the associated solder bumps. In particular embodiments, the system may first determine a first offset vector for the first portion (e.g., a top end) of the first element of interest (e.g., a first solder bump) with respect to the second portion (e.g., a bottom end) of the first element of interest (e.g., the first solder bump). Then, the system may determine a second offset vector for a first portion (e.g., a top end) of the second element of interest (e.g., a second solder bump) with respect to the second portion (e.g., a bottom end) of the second element of interest (e.g., the second solder bump). Then, the system may determine a rotation angle of a first layer of the inspected sample with respect to a second layer of the inspected sample based on the first offset vector and the second offset vector. The first layer of the inspected sample may be associated with the first portion of the first element of interest (e.g., the top end of the first solder bump) and the first portion of the second element of interest (e.g., the top end of the second solder bump). The second layer of the inspected sample may be associated with the second portion of the first element of interest (e.g., the bottom end of the first solder bump) and the second portion of the second element of interest (e.g., the bottom end of the second solder bump). In particular embodiments, instead of using the comparative method based on the cross-sectional shapes of different portions of a solder bump, the system may use determine the offset vectors based on the comparison of the reference images and the X-ray images of the elements of interest in the inspected sample. As an example and not by way of limitation, FIG. 3F shows a top view of an inspected IC part 370 which has a rotated IC component 371 with respect to the substrate 372. The rotation may be within a plane parallel to the substrate plane 372. The system may use the comparative method based on cross-sectional shapes or based on reference images to determine the residual patterns 374A, 374B, 374C, and 374D for corresponding solder bumps (not shown) which bond the IC component 371 to the substrate 372. The system may determine an offset vector (e.g., 377A, 377B, 377C, and 377D) for each of the solder bumps. Then, the system may determine the rotation angle and direction 373 and the rotation center 373 by aggregating the offset vectors of multiple solder bumps (e.g., 377A, 377B, 377C, and 377D). It is notable that in this example, the four solder bumps are arranged in a substantially symmetric confirmation. However, the systems, methods, processes, and principles are not limited thereto and are applicable to solder bumps with any suitable spatial arrangement. For example, to determine the rotation angle and direction of the IC component 371, the system may use the metrology information associated with any two or more solder bumps connecting the IC component 371 and the substrate 372. The two or more solder bumps may be spatially arranged in any suitable patterns (e.g., along a line, each at a corner of a triangle, along a circle, or arranged arbitrarily).

Measurement Based on Multiple X-Ray Images Captured from Different Angles

In particular embodiments, the system may use multiple images captured at different angles to measure the metrology parameters of the inspected solder bumps. Different types of solder bumps (e.g., shifted, stretched, suppressed, normal, etc.) may have different characteristics when viewed from different angles. The system may use the information extracted from X-ray images captured from different angles to characterize the inspected solder bumps, measure the associated metrology parameters, and determine the types of mis-placement of the associated IC component (e.g., shift, rotation, tilt, height variation, vertical offset, etc.). In particular embodiments, the system may generate and use X-ray images captured from the angles of +/−15 degrees with respect to the perpendicular direction of the IC substrate plane.

Measurement Based on Comparison to Adjacent Solder Bumps

In particular embodiment, the system may use a sliding window method to compare a solder bump of interest to its adjacent solder bumps. The system may determine the relative changes between the adjacent solder bumps and use this relative change information to characterize the mis-placement types. For example, an ideal IC part or an IC part with a shifted die would have uniform solder bumps and the system may not detect relative changes between adjacent solder bumps. As another example, an IC part with a rotated die would have rotating pattern amount the deformed solder bumps and the system may use this relative change information between adjacent solder bumps to identify the rotation direction. As another example, an IC part with a tilted die may have a linear changing pattern in the deformed solder bumps and the system may use this relative change information to identify the tilt direction. In particular embodiments, the system may use different algorithms to process the X-ray images and measure the metrology parameters based on the scale (e.g., large, middle, small) of the mis-placement magnitude.

Integrated Bonding Tool

Figure 4:
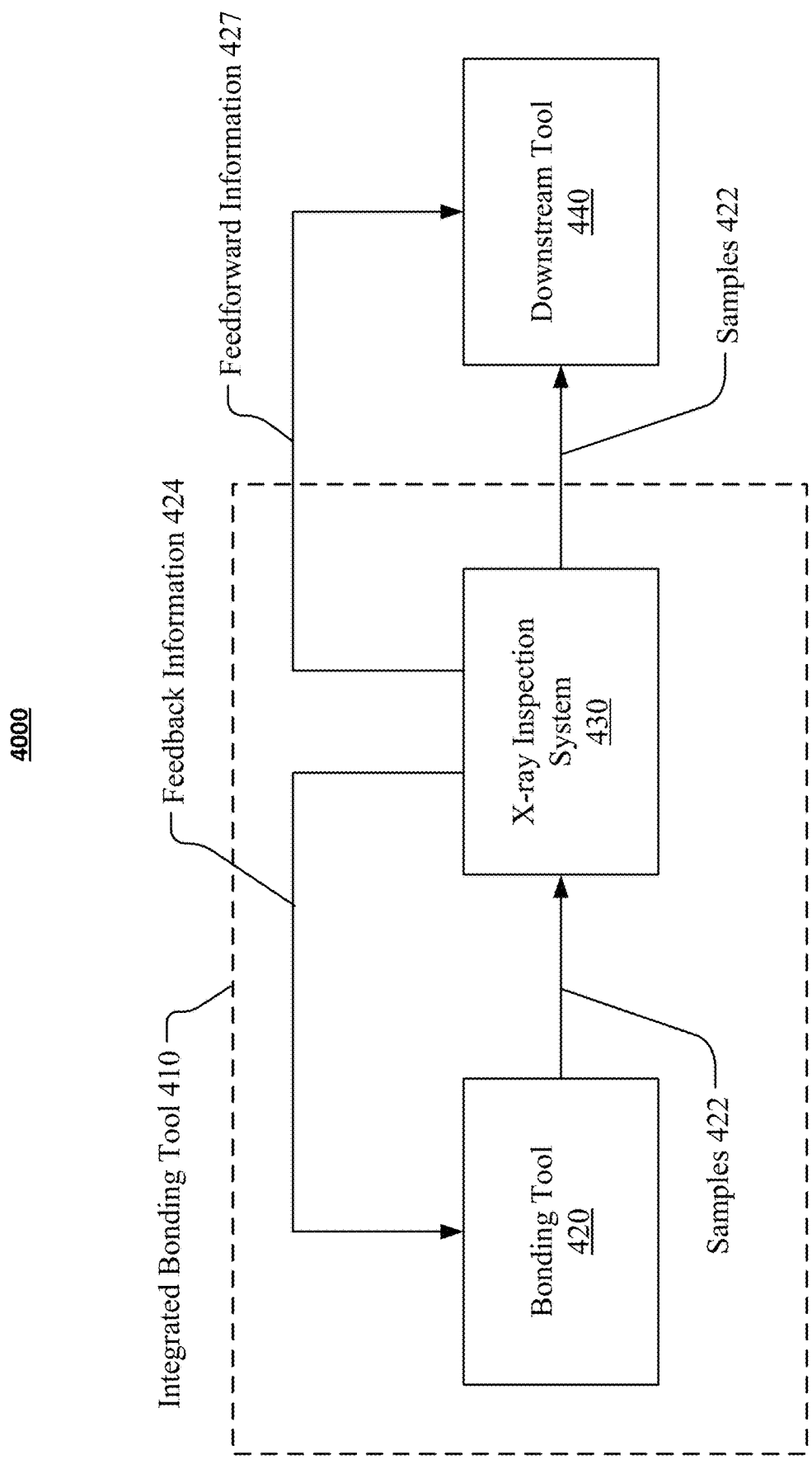
FIG. 4 illustrates an example process for generating feedback and feedforward information to the manufacturing process using the X-ray inspection system.

FIG. 4 illustrates an example process 4000 for generating feedback and feedforward information to the manufacturing process using the X-ray inspection system. In particular embodiments, the X-ray inspection system 430 may be integrated with a bonding tool 420 to form an integrated bonding tool 410. The X-ray inspection system 420 may be in line to the bonding tool 420 and may inspect the samples 422 processed by the bonding tool 420 in real-time while these samples are processed. The X-ray inspection system 430 may identify one or more problems associated in the inspected samples by measuring the placement parameters of the IC components. For example, the X-ray inspection system 430 may identify that the inspected samples have a shifted die, a rotated die, a tilted die, a mis-positioned die with a vertical offset, a die with a height variation. Based on the severity of the mis-placements, the problems may negatively affect the quality of the manufactured samples. The X-ray inspection system 430 may generate the feedback information 424 for the bonding tool 420. The feedback information 424 may include, for example, but are not limited to, the identified mis-placement types and related parameters, the metrology parameters of the IC components, the metrology parameters of the inspected solder bumps, the possible root reasons that caused the problems, etc. The X-ray inspection system 430 may send the feedback information 424 to the bonding tool 420 to cause the bonding tool 420 to: (1) adjust one or more parameters associated with the bonding process (e.g., alignment parameters, placement parameters, etc.) or (2) stop the bonding process to avoid producing more problematic samples. The bonding tool 420 with the adjusted parameters may eliminate the mis-placement problems in subsequently processed samples. In particular embodiments, the X-ray inspection system 430 may send feedback information to a dispense system to control the solder material volume dispensed during the bonding process. In particular embodiments, the integrated bonding tool 410 may allow an integrated measurement of bonds, voids, density in power devices, etc. In particular embodiments, the integrated bonding tool 410 may have the full bonded area of the IC parts measured by the X-ray inspection system 430 (e.g., measuring parameters related to all edges, corners, bumps, or any related features, etc.)

In particular embodiments, the X-ray inspection system 430 may generate feedforward information 427 for a downstream tool 440 of the same manufacturing process. The feedforward information 427 may include, for example, but are not limited to, the identified mis-placement types and related parameters, the metrology parameters of the IC components, the metrology parameters of the inspected solder bumps, the possible root reasons that caused the problems, etc. The X-ray inspection system 430 may send the feedforward information 427 to the downstream tool 440 to cause the downstream tool 440 to adjust one or more parameters associated with the downstream process (e.g., electrical testing, quality control, etc.). The downstream tool 440 with the adjusted parameters may correct the mis-placement problems in the processed samples, prevent these problems from negatively affecting the quality or functionality of the samples, or exclude the samples with these problems.

Example Method

FIG. 5 illustrates an example method 5000 for measuring placement parameters of IC components based on X-rays. The method may begin at step 510, an automated high-speed X-ray inspection system may generate an X-ray image of an inspected sample at a direction substantially orthogonal to a plane of the inspected sample, wherein the X-ray image is a high-resolution grayscale image. At step 520, the system may determine a first cross-sectional shape of a first portion of a first element of interest in the inspected sample. The first cross-sectional shape may be determined based on a number of grayscale values of the X-ray image associated with the first element of interest. At step 530, the system may determine a second cross-sectional shape of a second portion of the first element of interest in the inspected sample. The second cross-sectional shape may be determined based on the grayscale values of the X-ray image associated with the first element of interest. At step 540, the system may determine one or more first metrological parameters associated with the first element of interest in the inspected sample based a comparison of the first cross-sectional shape and the second cross-sectional shape.

In particular embodiments, the inspected sample may be an integrated circuit package. The first element of interest may be a solder bump of the integrated circuit package. In particular embodiments, the first cross-sectional shape and the second cross-sectional shape may be determined using an edge filter based on the grayscale values of the X-ray image associated with the first element of interest. In particular embodiments, the first cross-sectional shape and the second cross-sectional shape may be elliptical shapes or circular shapes. The first portion of the first element of interest may correspond to a first end of a solder bump and the second portion of the first element of interest may correspond to a second end of the solder bump. In particular embodiments, the system may determine one or more crescent areas corresponding to one or more non-overlapping areas of the first cross-sectional shape and the second cross-sectional shape. In particular embodiments, the system may determine an offset vector based on the one or more crescent areas. The offset vector may be associated with an offset distance and an offset direction of the second portion of the first element of interest with respect to the first portion of the first element of interest. The one or more first metrological parameters may include the offset distance and the offset direction.

In particular embodiments, the system may determine a misalignment metric of a first layer of the inspected sample with respect to a second layer of the inspected sample based on the offset distance and the offset direction. The first layer of the inspected sample may be associated with the first portion of the first element of interest and the second layer of the inspected sample may be associated with the second portion of the first element of interest. In particular embodiments, the system may determine one or more second metrological parameters associated with a second element of interest in the inspected sample based a comparison of a third cross-sectional shape of a third portion of the second element of interest and a fourth cross-sectional shape of a fourth portion of the second element of interest. In particular embodiments, the one or more first metrological parameters may include first size parameters of the first cross-sectional shape and the second cross-sectional shape of the first element of interest. The one or more second metrological parameters may include second size parameters of the third cross-sectional shape and the fourth cross-sectional shape of the second element of interest.

In particular embodiments, the system may determine a tilting angle of a first layer of the inspected sample with respect to a second layer of the inspected sample based on the first size parameters associated with the first element of interest and the second size parameters associated with the second element of interest. In particular embodiments, the system may determine a layer-distance offset of a first layer of the inspected sample with respect to a second layer of the inspected sample based on the first size parameters associated with the first element of interest and the second size parameters associated with the second element of interest. In particular embodiments, the system may determine a first offset vector for the first portion of the first element of interest with respect to the second portion of the first element of interest. The system may determine a second offset vector for the third portion of the second element of interest with respect to the fourth portion of the second element of interest. In particular embodiments, the system may determine a rotation angle of a first layer of the inspected sample with respect to a second layer of the inspected sample based on the first offset vector and the second offset vector. The first layer of the inspected sample may be associated with the first portion of the first element of interest and the third portion of the second element of interest. The second layer of the inspected sample may be associated with the second portion of the first element of interest and the fourth portion of the second element of interest. In particular embodiments, the system may generate a reference X-ray image for the inspected sample. The one or more first metrological parameters of the element of interest may be determined based on a comparison of the X-ray image of the inspected sample and the reference X-ray image.

In particular embodiments, the reference X-ray image may be generated based on an average of X-ray images of a number of reference samples. The reference samples may be the same type of samples to the inspected sample. In particular embodiments, the reference X-ray image may be generated based on a standard reference sample for the inspected sample. In particular embodiments, the system may determine one or more residual patterns by subtracting the reference X-ray image from the X-ray image of the inspected sample. The one or more first metrological parameters may be determined based on the one or more residual patterns. In particular embodiments, the one or more residual patterns may include one or more crescent areas. The one or more crescent areas may correspond to one or more non-overlapping areas of an image area in the X-ray image corresponding the first element of interest and a reference image area in the reference X-ray image corresponding to a reference element of interest.

In particular embodiments, the system may capture a single X-ray image for an IC part including an IC component and a substrate. The IC component may be bonded to the substrate through one or more solder bumps and connection pins. The system may measure one or more metrology parameters associated with one or more solder bumps connecting the IC component and the substrate. The system may determine one or more placement parameters based on the one or more metrology parameters of the one or more solder bumps. In particular embodiments, the metrology parameters associated with the inspected solder bumps may include for example, but are not limited to, a diameter, a diameter difference with respect to the reference solder bump, a central height, a central height difference with respect the reference solder bump, an edge height, an edge height difference with respect to the refence solder bump, a position of the solder bump (e.g., a center position), a position difference with respect to the reference solder bump, an ellipsoidal major axis, a difference of the ellipsoidal major axis with respect to the reference solder bump, a height along the major axis, a height difference along the major axis with respect to the reference solder bump, a total area of the solder bump top-down projection, a total area difference of the solder bump top-down projection with respect to the reference solder bump, etc.

In particular embodiments, the system may measure these parameters by directly using computer algorithm to process a single top-down X-ray image. In particular embodiments, the system may measure these parameters based on a comparative metrology (e.g., a subtraction method or a comparison method) by comparing the X-ray image of the inspected IC part to a reference image. In particular embodiments, the system may measure these parameters based on two or more X-ray image captured from different angles (e.g., top-down or oblique angles). In particular embodiments, the system may measure the placement parameters (e.g., positions, mis-placement parameters, alignment parameters) of the IC components (e.g., die or wafer) with respect to the corresponding substrates based on the metrology information of the associated solder bumps. In particular embodiments, the system may measure one or more parameters related to a tilt, a shift, a rotation, a vertical position offset, a height variation of the inspected IC components (e.g., dies or wafers).

Although this disclosure describes and illustrates particular steps of the method of FIG. 5 as occurring in a particular order, this disclosure contemplates any suitable steps of the method of FIG. 5 occurring in any suitable order. Moreover, although this disclosure describes and illustrates an example method for measuring placement parameters of IC components based on X-rays including the particular steps of the method of FIG. 5, this disclosure contemplates any suitable method for measuring placement parameters of IC components based on X-rays including any suitable steps, which may include all, some, or none of the steps of the method of FIG. 5, where appropriate. Furthermore, although this disclosure describes and illustrates particular components, devices, or systems carrying out particular steps of the method of FIG. 5, this disclosure contemplates any suitable combination of any suitable components, devices, or systems carrying out any suitable steps of the method of FIG. 5.

Advantages: Inspection Speed

A significant advantage of this invention is that an extended source of X-rays can be used, increasing the available flux of X-rays used for imaging. This in turn increases the throughput possible for the system. Put another way, in the time to acquire a single inspection image with a PPM system, the proposed invention can acquire over 300,000 images with the same resolution.

Consider the following comparison with the PPM X-ray system. The time to acquire an image depends on the flux $\Phi$ of X-rays:

$$T_{acquire} = (P_\# \times X_P)/\Phi$$

where $P_\#$ is the number of pixels, $X_P$ is the number of X-rays per pixel, and $\Phi$ is the X-ray flux. The X-ray flux from a point source is:

$$Flux = \Phi = \beta \times \Omega \times S_A$$

where $\beta$ is the point source brightness, $\Omega$ is the angular distribution in mrad$^2$ and $S_A$ is the point source area $S_A = \pi r^2$. The source spot size for X-ray systems is typically defined using the ASTM standard SE-1165 ["Standard Test Method for Measurement of Focal Spots of Industrial X-ray Tubes by Pinhole Imaging," ASTM Committee E-7 on Nondestructive Testing, May 15, 1992].

A typical X-ray source brightness $\beta$ is $$\beta = 10^8 \text{X-rays/sec/mm}^2/\text{mrad}^2.$$

To avoid parallax errors in automated inspection, the PPM X-ray beam should be well collimated; a divergence of 20 mrad is typical. For a point source with $$\Omega = (20 \text{ mrad})^2 = 400 \text{ mrad}^2$$

and a source spot diameter d=2r=1 μm=10$^{-3}$ mm, the flux is given by:

$$Flux = \Phi = \beta \times \Omega \times S_A$$
$$= 10^8 \times 400 \times \pi \times [0.5 \times 10^{-3}]^2 \text{ X-rays/sec}$$

-continued
$$= 400 \times \pi \times 0.25 \times 10^8 \times [10^{-3}]^2 \text{ X-rays/sec}$$
$$= 400 \times \pi \times 25 \text{ X-rays/sec}$$
$$= 31,416 = 3.14 \times 10^4 \text{ X-rays/sec}.$$

A typical X-ray image sensor may have 512×512 pixels that need 1,000 X-rays/pixel for image formation. An image for a PPM system will therefore be collected in approximately 8,350 seconds, or 2.3 hours.

On the other hand, keeping the same source brightness, but illuminating with a larger source spot size according to the invention dramatically increases the X-ray flux illuminating the object. As an example, assume a source with a 1 mm diameter (r=0.5 mm) separated by 100 mm from the object and, furthermore, assume that the distance from the object to scintillator is 100 microns. The angular divergence of the X-ray beam is given by:

$$\alpha = 1 \text{ mm}/100 \text{ mm} = 10 \text{ mrad},$$

making $$\Omega = 100 \text{ mrad}^2.$$

The spot area is $= \pi \times [0.5]^2 = 0.785 \text{ mm}^2$, so the flux becomes:

Flux=$\Omega$=10$^8$×100×0.785 photons/sec=7.85×10$^9$ photons/sec which is higher than the PPM configuration by a factor of 250,000 times. Therefore, the same 512×512 image (with 1,000 X-rays per pixel) can now be produced at high speed and, for example, may now have a proportionally faster image collection time of approximately 33 msec.

As a practical matter, the throughput enhancement may be further reduced by a factor of between 2 and 10 from this number. A PPM imaging system can detect X-rays in the enlarged shadow image directly with a CCD X-ray detector, which can have a quantum efficiency between 50% to 100%. The typical X-ray CCD array comprises an array of pixels, with a pixel size of approximately 100 μm×100 μm.

In comparison, the high-resolution direct-shadow images for the system of the disclosed invention come from an extended X-ray source, and are not magnified. The pixels of contemporary X-ray imaging detectors are far too large to resolve the proximity images. Instead, the invention disclosed here comprises a scintillator to convert the X-rays to optical photons, and then magnifies this optical image.

In order to achieve a particular resolution, there may be thickness specifications for the scintillator. For a resolution of 1 micron, for example, the scintillator may have a specified thickness between 1 and 10 microns. For thin scintillators, some of the incident X-rays will pass through the scintillator without being absorbed. Therefore, the quantum efficiency of this conversion process may worse than the PPM system, emitting visible photons for approximately 20% of the X-rays passing through the scintillator. Beyond this, the microscope may lose additional photons, depending on the optical system NA and the quantum efficiency of the visible CCD detector. However, even with these losses, the benefit provided by the higher flux of the extended source still provides a significant advantage.

Advantages: Imaging Resolution

The resolution of the prior art PPM system is determined by the spot size of the X-ray source. For example, a source with a 1 micron spot size will produce images with 1 micron resolution, assuming the system is operating at optimal resolution. Practically speaking, it is difficult to achieve resolution much below 1 micron with a PPM system, due to rapidly decreasing efficiency of the X-ray source for small spot sizes. As the spot size of the X-ray source decreases, the X-ray power must be reduced to avoid melting the X-ray target. Furthermore, the X-ray target must be made thinner, to reduce scattering in the target. As a result, for each 2× decrease in spot size, the flux from the source decreases a factor of about 10×.

For the imaging system according to the invention, the scintillator is in close proximity to the object being examined, and photons emitted are in proportion to the X-rays. For the optical system that relays the photons emitted by the scintillator to the detector, assuming a scintillator emission wavelength of $\lambda=535$ nm and a solid immersion optical system with NA≈1.75 comprising LuAG optical elements with refractive index n=1.84, the definition for the diffraction-limited resolution R of the optical system relaying scintillator photons to the detector is:

$$R = \frac{\lambda}{2^*NA} * = \frac{535 \text{ nm}}{2^*1.75} * = 153 \text{ nm}$$

which is 6.5 times smaller than the 1 micron resolution of the PPM system.

Advantages: Time to Market

The high speed at which non-destructive images at resolutions smaller than 50 microns can be gathered can improve the time to market for the development of manufacturing processes such as the flip chip interconnect (FCI) process described earlier. The destructive processes for failure analysis, also described earlier, can take weeks to collect a single image, and months to acquire statistical data on parts. Because of the rapid time in which images can be collected and analyzed using the system of the present invention, process development time for such products can be counted in days, and is typically a fraction of the total time required to design and bring to market a new product.

Furthermore, because of the enhanced resolution, the present invention can be used for the new FCI processes with pitches smaller than 50 microns. The present invention can be used for significantly smaller pitches, and still maintain the desired image resolution and speed. In terms of the product development cycle, an increase in time for feedback of one to several weeks has a distinct and significant impact on the time required to develop a new product. In a simple case, perhaps three to five cycles of setup and data collection may be sufficient to establish a process for a new device. In a more complex case, such as a high-density interposer or a 3D IC, tens or hundreds of iterations may be required. Without the present invention, each of these cycles may take several weeks, and the total time to market of the product may come to be dominated by these cycles. Clearly a method of determining the quality of fine pitch (50 microns and smaller) bonds at the time of processing offers a significant advantage.

The images and calculations produced by the system and methods disclosed herewith allow the quality of bonds to be examined immediately after bonding in a matter of seconds or minutes. In order to develop and qualify a new semiconductor product for mass production, many individual processes and the integration of these processes must be established, tuned, and tested. In the case of forming a through-silicon via (TSV) in a semiconductor wafer, the process flow typically requires that the vias be formed first and the capture pads be subsequently formed on the wafer surface over the vias. Since the capture pads obscure optical inspection of the vias themselves, in the absence of the present invention, the alignment between the vias and the capture pads may not be accurately determined at the time of manufacturing without cutting the silicon wafer and inspecting this feature in cross-section. Since this procedure is time consuming and also destroys the silicon wafer and any economic value contained within it, it is therefore undesirable.

In the case of bonding two or more chips or substrates or even complete wafers together using FCI, the alignment, bonding forth, bonding temperature, rate of heating, and rate of cooling among other factors must be tightly controlled. While control of manufacturing equipment and processes can enable some of the necessary control, inspection and measurement of features within the product that are not optically visible may also be required. Without the use of the apparatus disclosed in this invention, assembled parts must be cross-sectioned in order to be inspected. Given the fine pitch of the interconnect bonds and the very large quantity of connections, this procedure can take several weeks. Typically only a very small subset of the total interconnect bonds may actually be inspected.

The inability to inspect bonds quickly can add significantly to the length of time required to fine tune both individual process steps as well as the integration of multiple process steps to create a finished product. For example, consider a case where 25 iterations of the bonding process are required to develop and qualify a product. In the case without the apparatus disclosed in this invention, each iteration may require 1 week to build each group of samples under various process and tooling configurations. After manufacturing a group of samples, an additional 2 weeks may be required to cross-section individual units and inspect the quality and attributes of the bonds that have been created. The total time is therefore: 25 cycles×(1 week making+2 weeks inspection)=75.0 weeks.

With the use of the apparatus disclosed in this invention, the 2 weeks of inspection can be reduced to a few minutes by eliminating the need for time consuming cross-sectioning. The total time for the sequential cycles may now be calculated as: 25 cycles×(1 week making+1 hour inspection) =25.15 weeks, a reduction by 49.85 weeks (or 66% of the initial time to market). With high-volume consumer electronic devices such as mobile phones selling in volumes of more than 100 million units a year, it can be easily seen that a decrease in time to market by 50 weeks (almost one year) can have significant impact on the market. The apparatus may further be integrated into the bonding tool or via filling tool, for example the electrochemical deposition tool, to provide feedback to the bonding process in real time. The use of the apparatus in this way reduces time to market by many weeks and may in fact enable a product to enter the market that otherwise would be too costly or too late to market to have economic value.

Advantages: Product Yield and Cost

It has been reported that commercial production began on these devices with overall yields related to package assembly and interconnect in the range of 80%. This yield is far lower than typically accepted in the semiconductor field, and there is considerable additional cost associated with the scrap material. However, this particular part was determined to have such high commercial value that, even considering the cost associated with low yield, it was commercially feasible to produce with only 80% package assembly yield. In other lower-cost, more consumer-oriented segments of the market, pressure on pricing is much more intense, and it is unlikely that a product with package assembly yields at this level could be commercially viable. For this reason, it is necessary for the manufacturing process to be highly capable and tightly controlled, such that the amount of scrap product or yield loss resulting from the bonding process is reduced. Traditionally, package assembly yields are in the 98 to 99% range. Those skilled in the art will quickly realize that scrapping good chips by using poorly yielding bonding techniques, and packaging yields of 80% for lower value chips, are simply not acceptable.

It should be noted that, in the case of multiple dice mounted together either as a 3D IC or onto a high-density interposer, the failure of one connection on any chip will result in the scrapping of the entire MCP or package assembly. There may be thousands or tens of thousands of connections that must all function as designed. It is rare that any kind of rework or recovery of materials can be accomplished if any of the bonds are not produced correctly. For example, take the case when a processor chip with a cost of $10 is mounted together with four memory chips costing $5 each, or $20. The total cost of the chips is therefore $30. Chip assembly and packaging may add another $5 of cost for a total assembly cost of $35.

By using the images and measurements produced by the apparatus in this disclosure, the processes of aligning, inspection bonding can be controlled and monitored such that the yield can be rapidly increased. For MCP packages, in the example above, detecting a flaw between the first two dice will allow the packaging assembler to scrap the first two die only, and not require the loss of all five dice, therefore saving scrap costs and improving yield. It is common for well-controlled and monitored assembly processes to have yields of over 99.9%. The present invention allows a packaging assembler to achieve a yield of greater than or equal to 90% in MCP structures having more than 4 dice and having more than 100 TSVs per interposer or die layer at pitches where the smallest pitch is less than 100 microns. The same yield advantage may be achieved in the flip chip configuration having more than 400 microbumps at a pitch where the smallest pitch is less than 100 microns.

This same advantage in cost and yield can be seen at other steps in the manufacturing process for fine-pitch interposers and 3D die stacking, such as via fill monitor for voids, via capture pad alignment to via, alignment of chip-bump to chip or interposer pad, and quality of completed joint after bonding. It may also be used to measure bondline in the assembly of multiple slices of silicon devices or fine pitch interposers or between silicon devices and other materials of interest where this bondline thickness is critical to device performance.

Miscellaneous

Herein, "or" is inclusive and not exclusive, unless expressly indicated otherwise or indicated otherwise by context. Therefore, herein, "A or B" means "A, B, or both," unless expressly indicated otherwise or indicated otherwise by context. Moreover, "and" is both joint and several, unless expressly indicated otherwise or indicated otherwise by context. Therefore, herein, "A and B" means "A and B, jointly or severally," unless expressly indicated otherwise or indicated otherwise by context.

The scope of this disclosure encompasses all changes, substitutions, variations, alterations, and modifications to the example embodiments described or illustrated herein that a person having ordinary skill in the art would comprehend. The scope of this disclosure is not limited to the example embodiments described or illustrated herein. Moreover, although this disclosure describes and illustrates respective embodiments herein as including particular components, elements, feature, functions, operations, or steps, any of these embodiments may include any combination or permutation of any of the components, elements, features, functions, operations, or steps described or illustrated anywhere herein that a person having ordinary skill in the art would comprehend. Furthermore, reference in the appended claims to an apparatus or system or a component of an apparatus or system being adapted to, arranged to, capable of, configured to, enabled to, operable to, or operative to perform a particular function encompasses that apparatus, system, component, whether or not it or that particular function is activated, turned on, or unlocked, as long as that apparatus, system, or component is so adapted, arranged, capable, configured, enabled, operable, or operative. Additionally, although this disclosure describes or illustrates particular embodiments as providing particular advantages, particular embodiments may provide none, some, or all of these advantages.

What is claimed is:

1. A method comprising, by an automated high-speed X-ray inspection system:
    generating an X-ray image of an inspected sample at a direction substantially orthogonal to a plane of the inspected sample, wherein the X-ray image is a high-resolution grayscale image;
    determining a first cross-sectional shape of a first portion of a first element of interest in the inspected sample, wherein the first cross-sectional shape is determined based on a plurality of grayscale values of the X-ray image associated with the first element of interest;
    determining a second cross-sectional shape of a second portion of the first element of interest in the inspected sample, wherein the second cross-sectional shape is determined based on the plurality of grayscale values of the X-ray image associated with the first element of interest; and
    determining one or more first metrological parameters associated with the first element of interest in the inspected sample based a comparison of the first cross-sectional shape and the second cross-sectional shape.

2. The method of claim 1, wherein the inspected sample is an integrated circuit package, and wherein the first element of interest is a solder bump of the integrated circuit package.

3. The method of claim 1, wherein the first cross-sectional shape and the second cross-sectional shape are determined using an edge filter based on the plurality of grayscale values of the X-ray image associated with the first element of interest.

4. The method of claim 1, wherein the first cross-sectional shape and the second cross-sectional shape are elliptical shapes or circular shapes, and wherein the first portion of the first element of interest corresponds to a first end of a solder bump and the second portion of the first element of interest corresponds to a second end of the solder bump.

5. The method of claim 1, further comprising:
    determining one or more crescent areas corresponding to one or more non-overlapping areas of the first cross-sectional shape and the second cross-sectional shape.

6. The method of claim 5, further comprising:
    determining an offset vector based on the one or more crescent areas, wherein the offset vector is associated with an offset distance and an offset direction of the second portion of the first element of interest with respect to the first portion of the first element of interest, and wherein the one or more first metrological parameters comprise the offset distance and the offset direction.

7. The method of claim 6, further comprising:
determining a misalignment metric of a first layer of the inspected sample with respect to a second layer of the inspected sample based on the offset distance and the offset direction, wherein the first layer of the inspected sample is associated with the first portion of the first element of interest and the second layer of the inspected sample is associated with the second portion of the first element of interest.

8. The method of claim 1, further comprising:
determining one or more second metrological parameters associated with a second element of interest in the inspected sample based a comparison of a third cross-sectional shape of a third portion of the second element of interest and a fourth cross-sectional shape of a fourth portion of the second element of interest.

9. The method of claim 8, wherein the one or more first metrological parameters comprise first size parameters of the first cross-sectional shape and the second cross-sectional shape of the first element of interest, and wherein the one or more second metrological parameters comprise second size parameters of the third cross-sectional shape and the fourth cross-sectional shape of the second element of interest.

10. The method of claim 9, further comprising:
determining a tilting angle of a first layer of the inspected sample with respect to a second layer of the inspected sample based on the first size parameters associated with the first element of interest and the second size parameters associated with the second element of interest.

11. The method of claim 9, further comprising:
determining a layer-distance offset of a first layer of the inspected sample with respect to a second layer of the inspected sample based on the first size parameters associated with the first element of interest and the second size parameters associated with the second element of interest.

12. The method of claim 8, further comprising:
determining a first offset vector for the first portion of the first element of interest with respect to the second portion of the first element of interest; and
determining a second offset vector for the third portion of the second element of interest with respect to the fourth portion of the second element of interest.

13. The method of claim 12, further comprising:
determining a rotation angle of a first layer of the inspected sample with respect to a second layer of the inspected sample based on the first offset vector and the second offset vector, wherein the first layer of the inspected sample is associated with the first portion of the first element of interest and the third portion of the second element of interest, and wherein the second layer of the inspected sample is associated with the second portion of the first element of interest and the fourth portion of the second element of interest.

14. The method of claim 1, further comprising:
generating a reference X-ray image for the inspected sample, wherein the one or more first metrological parameters of the element of interest are determined based on a comparison of the X-ray image of the inspected sample and the reference X-ray image.

15. The method of claim 14, wherein the reference X-ray image is generated based on an average of X-ray images of a plurality of reference samples, and wherein the plurality of reference samples are the same type of samples to the inspected sample.

16. The method of claim 14, wherein the reference X-ray image is generated based on a standard reference sample for the inspected sample.

17. The method of claim 14, further comprising:
determining one or more residual patterns by subtracting the reference X-ray image from the X-ray image of the inspected sample, wherein the one or more first metrological parameters are determined based on the one or more residual patterns.

18. The method of claim 17, wherein the one or more residual patterns comprise one or more crescent areas, and wherein the one or more crescent areas correspond to one or more non-overlapping areas of an image area in the X-ray image corresponding the first element of interest and a reference image area in the reference X-ray image corresponding to a reference element of interest.

19. One or more computer-readable non-transitory storage media embodying software that is operable when executed to:
generate an X-ray image of an inspected sample at a direction substantially orthogonal to a plane of the inspected sample, wherein the X-ray image is a high-resolution grayscale image;
determine a first cross-sectional shape of a first portion of a first element of interest in the inspected sample, wherein the first cross-sectional shape is determined based on a plurality of grayscale values of the X-ray image associated with the first element of interest;
determine a second cross-sectional shape of a second portion of the first element of interest in the inspected sample, wherein the second cross-sectional shape is determined based on the plurality of grayscale values of the X-ray image associated with the first element of interest; and
determine one or more first metrological parameters associated with the first element of interest in the inspected sample based a comparison of the first cross-sectional shape and the second cross-sectional shape.

20. An automatic high-speed X-ray system comprising: one or more X-ray sensors; one or more processors; and one or more computer-readable non-transitory storage media coupled to one or more of the processors and comprising instructions operable when executed by one or more of the processors to cause the system to:
generate an X-ray image of an inspected sample at a direction substantially orthogonal to a plane of the inspected sample, wherein the X-ray image is a high-resolution grayscale image;
determine a first cross-sectional shape of a first portion of a first element of interest in the inspected sample, wherein the first cross-sectional shape is determined based on a plurality of grayscale values of the X-ray image associated with the first element of interest;
determine a second cross-sectional shape of a second portion of the first element of interest in the inspected sample, wherein the second cross-sectional shape is determined based on the plurality of grayscale values of the X-ray image associated with the first element of interest; and
determine one or more first metrological parameters associated with the first element of interest in the inspected sample based a comparison of the first cross-sectional shape and the second cross-sectional shape.

* * * * *